(12) United States Patent
Lee et al.

(10) Patent No.: US 12,557,609 B2
(45) Date of Patent: Feb. 17, 2026

(54) METHODS FOR DRY PRINTING CARBON NANOTUBE MEMBRANES

(71) Applicant: Taiwan Semiconductor Manufacturing Company, Ltd., Hsinchu (TW)

(72) Inventors: Hsin-Chang Lee, Zhubei (TW); Wei-Hao Lee, Taipei (TW); Pei-Cheng Hsu, Taipei (TW); Huan-Ling Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 832 days.

(21) Appl. No.: 17/692,561

(22) Filed: Mar. 11, 2022

(65) Prior Publication Data

US 2023/0026114 A1 Jan. 26, 2023

Related U.S. Application Data

(60) Provisional application No. 63/224,892, filed on Jul. 23, 2021.

(51) Int. Cl.
*C01B 32/16* (2017.01)
*B82Y 40/00* (2011.01)
*G03F 1/64* (2012.01)
*H01L 21/027* (2006.01)

(52) U.S. Cl.
CPC .......... *H01L 21/0276* (2013.01); *C01B 32/16* (2017.08); *G03F 1/64* (2013.01); *B82Y 40/00* (2013.01); *C01P 2004/13* (2013.01); *C01P 2004/64* (2013.01)

(58) Field of Classification Search
CPC ..... C01B 32/16; C01B 32/162; C01B 32/164; C01B 32/168
See application file for complete search history.

(56) References Cited

U.S. PATENT DOCUMENTS

| | | | |
|---|---|---|---|
| 7,763,231 B2 * | 7/2010 | Gardner | C01B 32/162 977/773 |
| 2019/0036102 A1 * | 1/2019 | Pierce | C01B 32/16 |
| 2023/0227313 A1 * | 7/2023 | Li | B82Y 40/00 423/445 R |

* cited by examiner

*Primary Examiner* — Michael P Wieczorek
(74) *Attorney, Agent, or Firm* — Lippes Mathias LLP

(57) ABSTRACT

Methods for preparing a nanotube membrane for use in a pellicle membrane using dry printing are disclosed. Nanotube fibers are produced in a reaction vessel and dry sprayed onto a filter to form the nanotube membrane. The thickness of the nanotube membrane can be controlled by moving the reaction vessel and the filter relative to each other, or by further processing to reduce the thickness of the layer deposited onto the filter. This method reduces the number of process steps, reducing overall production time, and can also be used to produce larger membranes. The pellicle membrane can be formed with multiple layers and has a combination of high transmittance, low deflection, and small pore size. A conformal coating may applied to an outer surface of the pellicle membrane to protect the pellicle membrane from damage that can occur due to heat and hydrogen plasma created during EUV exposure.

20 Claims, 23 Drawing Sheets

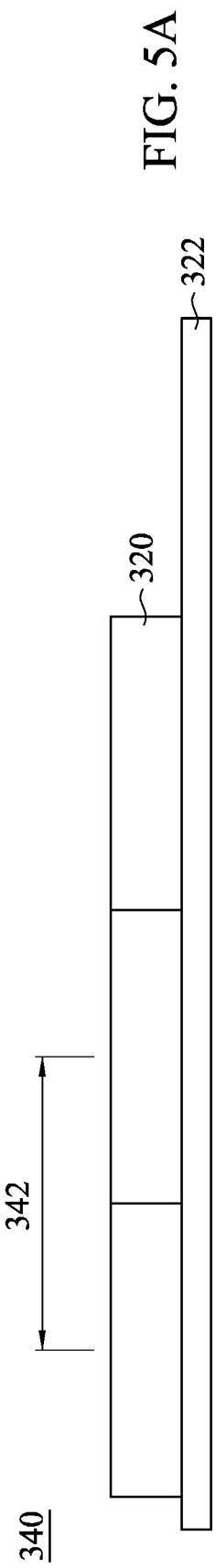
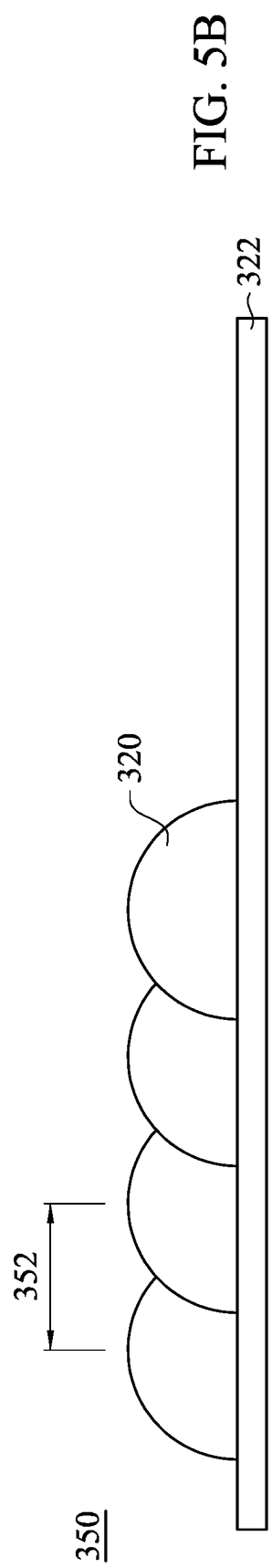
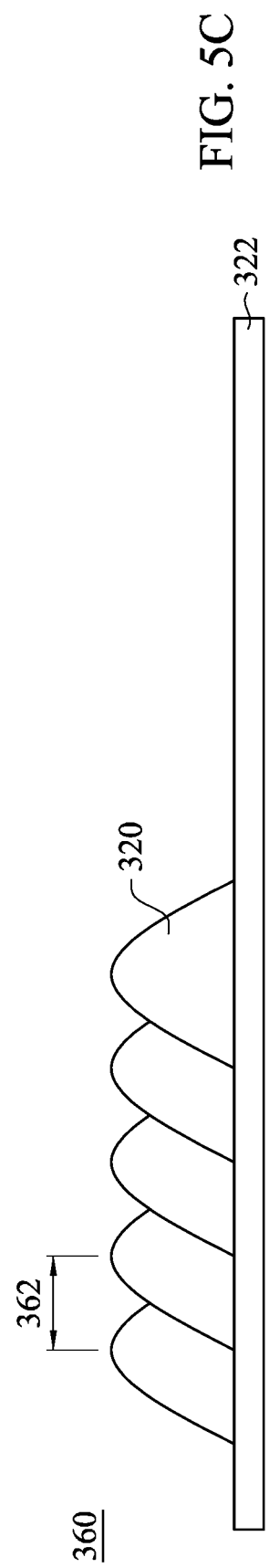
FIG. 5A
FIG. 5B
FIG. 5C

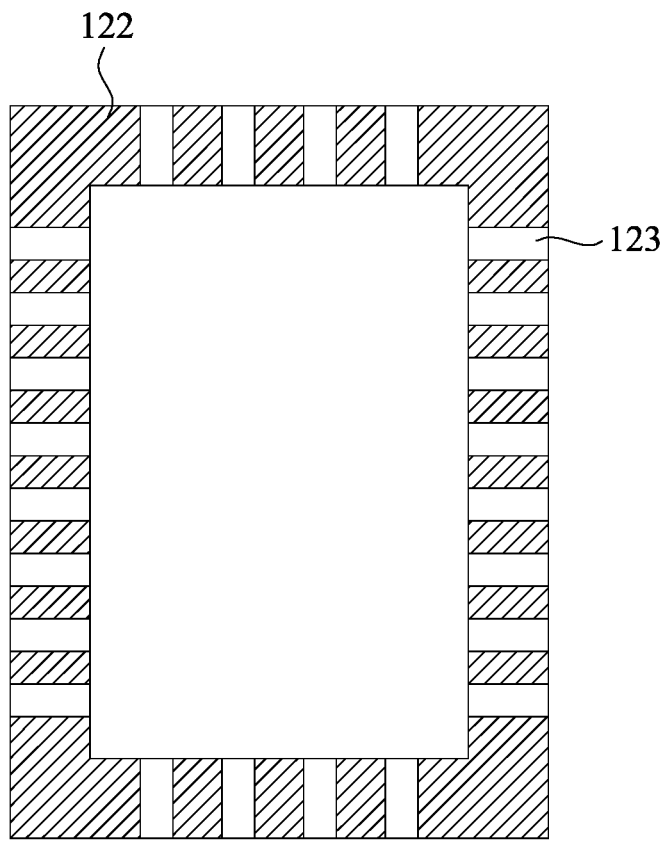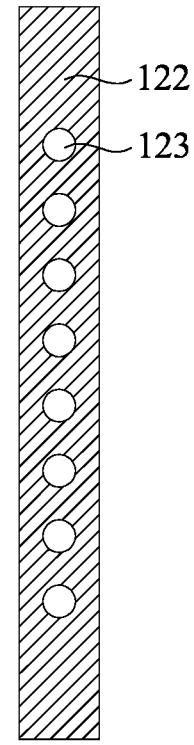
FIG. 11A  FIG. 11B
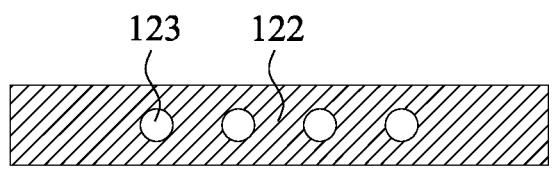
FIG. 11C

METHODS FOR DRY PRINTING CARBON NANOTUBE MEMBRANES

PRIORITY CLAIM AND CROSS-REFERENCE

This application claims priority to U.S. Provisional Patent Application Ser. No. 63/224,892, filed on Jul. 23, 2021, which is incorporated by reference in its entirety.

BACKGROUND

A photolithographic patterning process uses a reticle (i.e. photomask) that includes a desired mask pattern. The reticle may be a reflective mask or a transmission mask. In the process, ultraviolet light is reflected off the surface of the reticle (for a reflective mask) or transmitted through the reticle (for a transmission mask) to transfer the pattern to a photoresist on a semiconductor wafer. The minimum feature size of the pattern is limited by the light wavelength. Deep ultraviolet (UV) lithography uses a wavelength of 193 nm or 248 nm. Extreme ultraviolet (EUV) light, which spans wavelengths from 124 nanometers (nm) down to 10 nm, is currently being used to provide small minimum feature sizes. At such short wavelengths, particle contaminants on the photomask can cause defects in the transferred pattern.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a first diagram, FIG. 3B is a second diagram, FIG. 3C is a third diagram, and FIG. 3D is a fourth diagram.

In FIG. 4A, the deposit has a rectangular shape. In FIG. 4B, the deposit has a hemispherical shape. In FIG. 4C, the deposit has a triangular or Gaussian shape.

FIG. 5A-5C are side view of different embodiments of nanotube membranes deposited on a filter. FIG. 5A is a first embodiment, FIG. 5B is a second embodiment, and FIG. 5C is a third embodiment.

FIG. 10A is a first embodiment, and FIG. 10B is a second embodiment.

FIGS. 11A-11C are different views of a mounting frame, in accordance with some embodiments. FIG. 11A is a plan cross-sectional view, FIG. 11B is a first side view, and FIG. 11C is a front side view.

FIG. 13A is a first diagram, FIG. 13B is a second diagram, and FIG. 13C is a third diagram.

FIG. 15A is a first diagram, FIG. 15B is a second diagram, and FIG. 15C is a third diagram.

FIG. 16A is a first diagram, FIG. 16B is a second diagram, FIG. 16C is a third diagram, and FIG. 16D is a fourth diagram.

FIG. 17A is a first diagram, FIG. 17B is a second diagram, FIG. 17C is a third diagram, and FIG. 17D is a fourth diagram.

DETAILED DESCRIPTION

Figure 1:
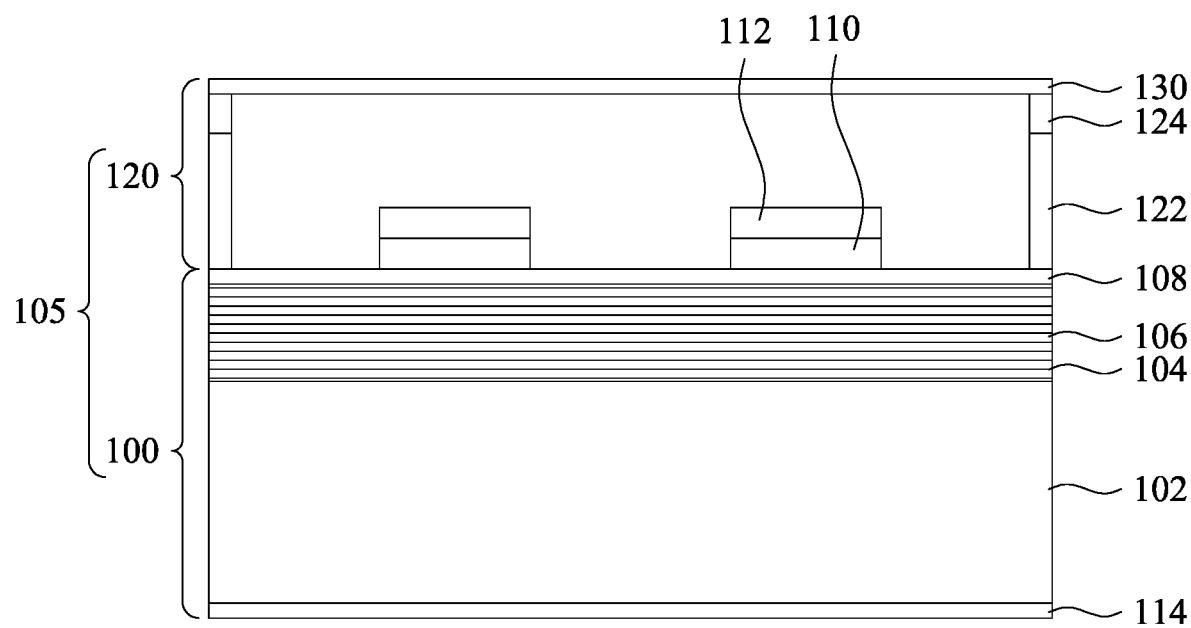
FIG. 1 is a cross-sectional view of an example reticle and pellicle assembly, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The present disclosure may refer to temperatures for certain method steps. It is noted that these references are usually to the temperature at which the heat source is set, and do not specifically refer to the temperature which must be attained by a particular material being exposed to the heat.

At shorter light wavelengths, particle contaminants on the reticle can cause defects in the transferred pattern. Thus, a pellicle assembly (or simply pellicle) is used to protect the reticle from such particles. The pellicle assembly includes a pellicle membrane which is attached to a mounting frame. The mounting frame supports the pellicle membrane over the reticle. Any contaminating particles which land on the pellicle membrane are thus kept out of the focal plane of the reticle, thus reducing or preventing defects in the transferred pattern.

The present disclosure thus relates to systems and methods for producing nanotube membranes that can be used in pellicle membranes, which maintain high transmittance of EUV light and the particle-protecting ability of the pellicle membrane. Briefly, the nanotube membranes are made using dry printing methods that avoid the need to disperse the nanotubes in a solvent. This reduces the number of processing steps, the time needed to produce nanotube membranes, and increase possible membrane sizes.

The present disclosure also relates to pellicle membranes that include layers made from such nanotube membranes. In some embodiments, the pellicle membrane is a single-layer structure. In other embodiments, the pellicle membrane is a multi-layer structure. In some embodiments, the layers of the multi-layer structure can be made of the same materials, and in other embodiments the layers of the multi-layer structure can be made of different materials selected for particular purposes and arranged in order as desired. For example, in some embodiments, the pellicle membrane may comprise one or more nanotube membrane layers and one or more graphene membrane layers. A combination of several low-density membrane layers can be used to obtain a pellicle membrane that has a combination of high transmittance, small pore size and a stiffness which minimizes any potential deflection.

The pellicle membrane can be attached to a border or to a suitably shaped mounting frame for mounting to the reticle. In some embodiments, a conformal coating is then applied to the outer surface of the pellicle membrane (which can be a single layer or a multi-layer structure). The coated pellicle membrane/border can then be affixed to a mounting frame (if needed) to form a pellicle assembly which can be mounted onto a reticle.

Initially, FIG. 1 illustrates a cross-sectional view of an example reticle assembly 105 useful in lithography, according to some embodiments. The reticle assembly 105 includes a reticle 100 and a pellicle assembly 120. The illustrative reticle 100 (also referred to in the art as a mask, photomask, or similar phraseology) is a reflective mask of a type commonly used in EUV lithography, and includes a substrate 102, alternating reflective layers 104 and spacing layers 106, a capping layer 108, an EUV absorbing layer 110 that is patterned to define a mask pattern, an anti-reflective coating (ARC) 112, and a conductive backside layer 114. The illustrative reticle 100 is merely a nonlimiting example.

More generally, pellicles as disclosed herein can be used with substantially any type of reflective or transmission reticle. As another example (not shown), the reticle may be a transmission reticle, in which case the substrate is transmissive for light at the wavelength at which the lithography is performed.

In general, the reflective or transmissive reticle includes a substrate (e.g. substrate 102) and a mask pattern (e.g. absorbing layer 110) disposed on the substrate. As illustrated here, the pellicle assembly 120 includes a mounting frame 122, an adhesive layer 124, and a pellicle membrane 130. In some non-limiting illustrative embodiments, the reticle and pellicle assembly are intended for use with EUV light wavelengths, for example from 124 nm to 10 nm, including about 13.5 nm.

In embodiments, the substrate 102 is made from a low thermal expansion material (LTEM), such as quartz or titania silicate glasses available from Corning under the trademark ULE. This reduces or prevents warping of the reticle due to absorption of energy and consequent heating. The reflective layers 104 and the spacing layers 106 cooperate to form a Bragg reflector for reflecting EUV light. In some embodiments, the reflective layers may comprise molybdenum (Mo). In some embodiments, the spacing layers may comprise silicon (Si). The capping layer 108 is used to protect the reflector formed from the reflective layers and the spacing layers, for example from oxidation. In some embodiments, the capping layer comprises ruthenium (Ru). The EUV absorbing layer 110 absorbs EUV wavelengths, and is patterned with the desired pattern. In some embodiments, the EUV absorbing layer comprises tantalum boron nitride. The anti-reflective coating (ARC) 112 further reduces reflection from the EUV absorbing layer. In some embodiments, the anti-reflective coating comprises oxidized tantalum boron nitride. The conductive backside layer 114 permits mounting of the illustrative reticle on an electrostatic chuck and temperature regulation of the mounted substrate 102. In some embodiments, the conductive backside layer comprises chrome nitride.

The mounting frame 122 supports the pellicle membrane at a height sufficient to take the pellicle membrane 130 outside the focal plane of the lithography, e.g., several millimeters (mm) over the reticle in some nonlimiting illustrative embodiments. The mounting frame itself can be made from suitable materials such as anodized aluminum, stainless steel, plastic, silicon (Si), titanium, silicon dioxide, aluminum oxide ($Al_2O_3$), or titanium dioxide ($TiO_2$). Vent holes may be present in the mounting frame for equalizing pressure on both sides of the pellicle membrane.

The adhesive layer 124 is used to secure the pellicle membrane to the mounting frame. Suitable adhesives may include a silicon, acrylic, epoxy, thermoplastic elastomer rubber, acrylic polymer or copolymer, or combinations thereof. In some embodiments, the adhesive can have a crystalline and/or amorphous structure. In some embodiments, the adhesive can have a glass transition temperature (Tg) that is above a maximum operating temperature of the photolithography system, to prevent the adhesive from exceeding the Tg during operation of the system.

Figure 2:
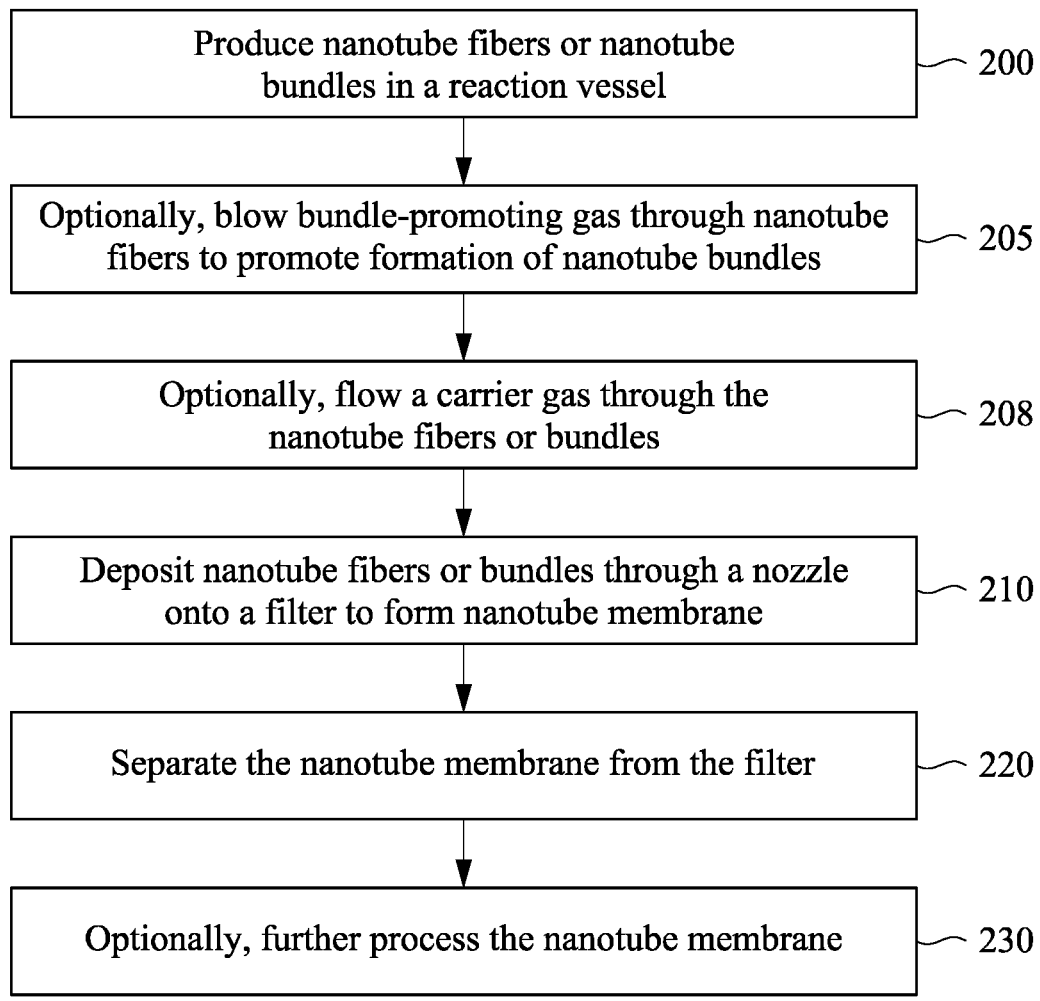
FIG. 2 is a flow chart illustrating a method for preparing a nanotube membrane by dry printing in accordance with some embodiments.

Continuing, FIG. 2 is a flow chart illustrating a method for preparing a nanotube membrane by dry printing, according to some embodiments of the present disclosure. These method steps are also illustrated in FIGS. 3A-3D. Briefly, "dry printing" is used herein to indicate that the nanotubes of the nanotube membrane are produced without the use of a liquid solvent. It is noted that the discussion below describes the formation of a nanotube membrane, but applies equally to the formation of multiple nanotube membranes.

First, in step 200, nanotube fibers or nanotube bundles are produced in a reaction vessel. The phrase "nanotube fiber" is used to indicate a fiber formed from one to 10 individual nanotubes wrapped around each other (i.e. helically). The phrase "nanotube bundle" refers to more than 10 individual nanotubes wrapped around each other. While there is no theoretical limit, in particular embodiments a nanotube bundle may be formed from a maximum of 20 nanotubes. The nanotubes in the nanotube fiber or bundle may be single-walled nanotubes or multi-walled nanotubes. The walls of a multi-walled nanotube are arranged concentrically, not helically, and a multi-walled nanotube itself should not be considered a nanotube bundle. Various gases, particularly carbon monoxide or carbon dioxide, can be used to promote the formation of nanotube bundles, as will be explained further herein.

In optional step 205, a bundle-promoting gas, such as carbon monoxide or carbon dioxide, is blown into the nanotube fibers to promote the formation of nanotube bundles. This is done upstream of the nozzle and may be considered to be located within the reaction vessel, though downstream of the heat source.

In optional step 208, a carrier gas is flowed through the nanotube fibers or bundles upstream of the nozzle (again, within the reaction vessel). Such carrier gas ideally does not react with the nanotube fibers or bundles at the prevailing conditions. The carrier gas may be, for example, ambient air, nitrogen ($N_2$), etc.

Next, in step 210, the nanotube fibers or bundles are deposited through a nozzle downstream of the reaction vessel and onto a filter to form the nanotube membrane. This is typically done by spraying the nanotube fibers/bundles onto the filter.

The filter may be a paper or polymer comprised of any suitable material, such as nitrocellulose, nylon, polytetrafluoroethylene (PTFE), polyvinyl chloride (PVC), silver, polycarbonate, or a combination thereof. For example, PTFE filters are commercially available under the names FLUOROPORE and OMNIPORE. Polycarbonate filters are commercially available under the name ISOPORE. The filter is desirably made of a material that has low surface energy, for example low van der Waals forces, for ease of separation of the resulting nanotube membrane from the filter.

Suction can be applied to the opposite side of the filter to obtain a uniform dispersion of the deposited nanotube fibers or bundles on the filter, and to hold them in place on the filter. In some embodiments, the suction pressure is from about −85 kPa to about −40 kPa, although this can vary as desired.

The filter moves relative to the nozzle/reaction vessel. In particular embodiments, the filter may be moved uniaxially or biaxially along the x-axis and y-axis, or the filter may be rotated. Alternatively, the nozzle/reaction vessel combination is moved, while the filter remains stationary. As a result, a nanotube membrane of relatively uniform thickness can be formed on the filter. The movement can be performed using methods known in the art. For example, motors, air-floated platforms, or other comparable electro-mechanical means or combinations thereof may be used to move either component. It is noted that the filter can also be moved in the z-axis so as to obtain a relatively even distribution of the nanotubes, but is typically maintained at a given position in the z-axis while the nanotubes are being deposited.

In step 220, the nanotube membrane is separated from the filter. This can be done, for example, by peeling them apart.

In optional step 230, the nanotube membrane can be further processed. For example, the thickness of the nanotube membrane can be reduced in order to improve its mechanical properties, or the edges of the nanotube membrane can be trimmed off, or a single membrane can be divided into multiple membranes, etc.

The dry printing methods of the present disclosure can be contrasted with current methods for producing nanotube membranes. In a "wet filtration" method, the nanotubes are suspended in a liquid. Other ingredients, such as surfactants, may be needed to disperse the nanotubes evenly. Additional steps, such as ultrasonication, may also be useful for even dispersion of the nanotubes. The nanotube membrane is then formed by depositing the suspension on a surface and separating the liquid from the nanotubes. For example, the suspension can be poured through filter paper. Suction is applied to increase the uniformity of the membrane. The nanotube membrane is then separated from the filter, for example, by using a solvent which selectively wets one of the two components or in which the two components have a different surface tension (causing separation). The nanotube membrane is then attached to a frame, which is done manually and can easily cause damage to the membrane. Then the membrane needs to be dried to be useful, which can take several hours. The additional processing steps also increase production time. The need to use liquids also reduces the membrane size that can be produced with acceptable uniformity. Removal of the need to dry the membrane and several processing steps simplifies nanotube membrane production and reduces production time as well.

In some embodiments, the nanotubes can be carbon nanotubes (CNTs) or boron nitride nanotubes (BNNTs) or silicon carbide nanotubes (SiCNTs) or molybdenum disulfide nanotubes ($MoS_2NTs$) or molybdenum diselenide ($MoSe_2NTs$) or tungsten disulfide nanotubes ($WS_2NTs$) or tungsten diselenide nanotubes ($WSe_2NTs$). In some embodiments, the nanotubes can be metallic or semiconducting or electrically insulating.

In some embodiments, the nanotubes can be single-wall nanotubes or multi-wall nanotubes. It is possible for multi-wall nanotubes to be made of different materials, for example a CNT inside a BNNT, or vice versa. In some embodiments, single-wall nanotubes may have a diameter from about 0.2 nanometers (nm) to about 4 nm, and a length of about 0.5 micrometers (μm) to about 30 μm, although these may vary. In some embodiments, multi-wall nanotubes may have a diameter from about 10 nm to about 250 nm, and a length of about 250 μm to about 400 μm, although these may vary. In some embodiments, the length of the individual nanotubes may be from about 1,000 μm to about 6 centimeters (cm) as well. It is noted that typically a mix of single-wall nanotubes and multi-wall nanotubes may be present in the nanotube membrane. Because high UV transmittance is desired and multi-wall nanotubes have relatively lower UV transmittance, the amount of multi-wall nanotubes in the nanotube fibers or bundles of the present disclosure is usually less than 50% by number.

The nanotubes may have different properties. For example, carbon nanotubes can have a Young's modulus of about 1.33 TPa; a maximum tensile strength of about 100 GPa; thermal conductivity of about 3,000 to about 40,000 W/m K; and be stable up to a temperature of about 400° C. in air. Boron nitride nanotubes can have a Young's modulus of about 1.18 TPa; a maximum tensile strength of about 30 GPa; thermal conductivity of about 3000 W/m K; and be stable up to a temperature of about 800° C. in air.

Continuing, the nanotubes in the nanotube membrane can be produced using several different fabrication processes. For example, such fabrication processes can include chemical vapor deposition (CVD) such as floating catalyst CVD or plasma-enhanced CVD; and electrophoretic deposition.

Generally, the nanotubes are produced in a reaction vessel, such as a 2-inch quartz reactor tube. The reaction vessel may be equipped with a heat source along its length in order to maintain a specified temperature inside the vessel. The temperature inside the vessel may range from about 500° C. to about 1000° C. Gaseous reactants and a catalyst are introduced into the reaction vessel to grow the nanotubes. Carbon sources may include, for example, ethylene, ferrocene, toluene, methane, benzene, phenylacetylene, fullerene, or cyclohexane. In some embodiments, the gaseous reactants may include argon, hydrogen, and/or ethylene. The partial pressure of argon may range from about 500 mmHg to about 600 mmHg. The partial pressure of hydrogen may range from about 10 mmHg to about 100 mmHg. The partial pressure of the carbon source may range from about 50 mmHg to about 250 mmHg. In some embodiments, the catalyst may be an Iron-Gadolinium (Fe—Gd) alloy film, or another Fe-Lanthanide element alloy. Generally, lanthanide elements enhance the growth rate of nanotubes when used with a Fe catalyst.

In other embodiments, the nanotubes can be formed by direct spinning nanotubes from a floating catalyst CVD system. The direct spinning process begins by providing a reaction vessel. The reaction vessel may have a length of greater than five meters for an increased growth path but can also be shorter. The reaction vessel may also be equipped with a heat source to ensure a specified temperature in the reaction vessel. The temperature inside the vessel may range from about 500° C. to about 1300° C. For example, ferrocene is introduced into the reaction vessel as both a carbon source and an iron catalyst along with hydrogen and sulfur (e.g. in the form of thiophene). Nanotubes are then grown in the vessel and are capable of being spun into a fiber.

In this regard, sulfur acts as a catalyst to improve the growth of the nanotubes. Sulfur acts as a promoter to enhance the addition of carbon atoms to the growing ends of graphene tubes. Sulfur also acts as a surfactant to encourage tube nucleation and thus prevent carbon encapsulation of the catalyst particle. Additionally, sulfur limits the rate at which the iron particles coarsen by collision. Further, sulphur prevents iron that is deposited on the reactor wall from nucleating and growing nanotubes.

Figure 3A:
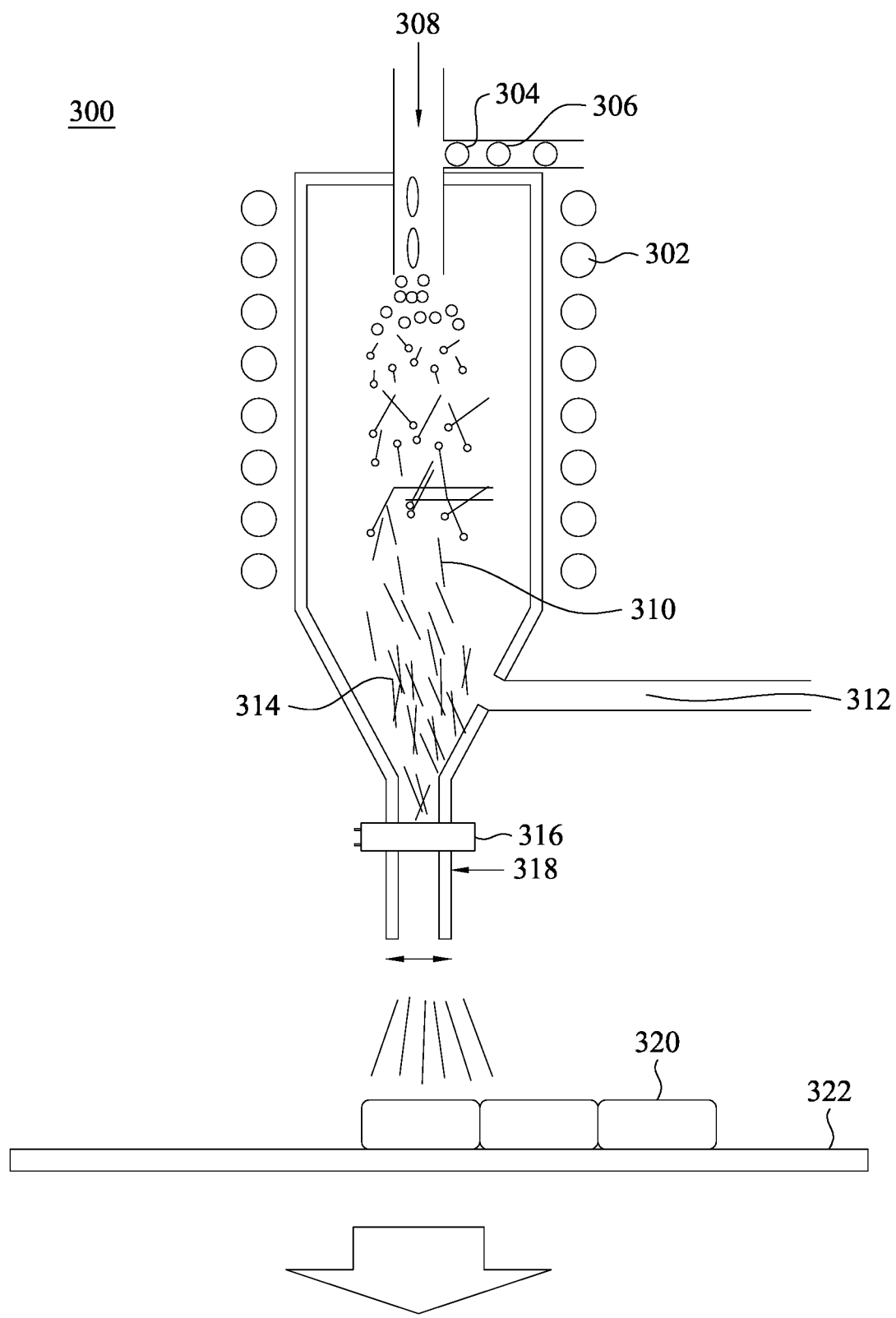
FIG. 3A-3D are a set of diagrams illustrating the various steps of FIG. 2, in accordance with some embodiments.

FIG. 3A is a drawing illustrating one embodiment for performing step 200 of the method of FIG. 2. A reaction vessel 300 is illustrated, with a heat source 302 for heating materials passing through the reaction vessel. Reactants 304, catalyst 306, and carrier gas 308 enter the reaction vessel. Nucleation, growth, and aggregation of nanotubes produce nanotube fibers 310. In some embodiments, this process occurs at temperatures of about 1100° C. to about 1300° C. This results in the nanotubes being directionally oriented (i.e., oriented in the same direction). A bundle-promoting gas 312, such as CO or $CO_2$, can be blown downstream of the reaction vessel through the nanotubes/nanotube fibers to promote the formation of nanotube bundles 314.

The fibers/bundles are then sprayed through a nozzle 318 to form deposits 320 onto a filter 322. Suction can be applied to the filter 322 to ensure uniform distribution of the fibers/bundles on the filter. The deposition of the fibers/bundles is controlled by a flow control valve 316, such as an electromagnetic valve or a diaphragm valve, located downstream of the reaction vessel 300 (and above the filter 322). The valve 316 can be opened and closed as desired to control the flow of nanotube fibers/bundles, as well as to control the shape of the resulting deposition onto the filter.

With respect to the use of a bundle-promoting gas, CO and $CO_2$ encourage the bundling of the nanotubes through dismutation. Dismutation is a reduction-oxidation reaction two molecules of an intermediate oxidation state are converted into one molecule of a higher oxidation state and one molecule of a lower oxidation state. Without being bound by theory, it is believed that this causes dangling bonds to be formed, which promotes bundling between different nanotubes.

Figure 3B:
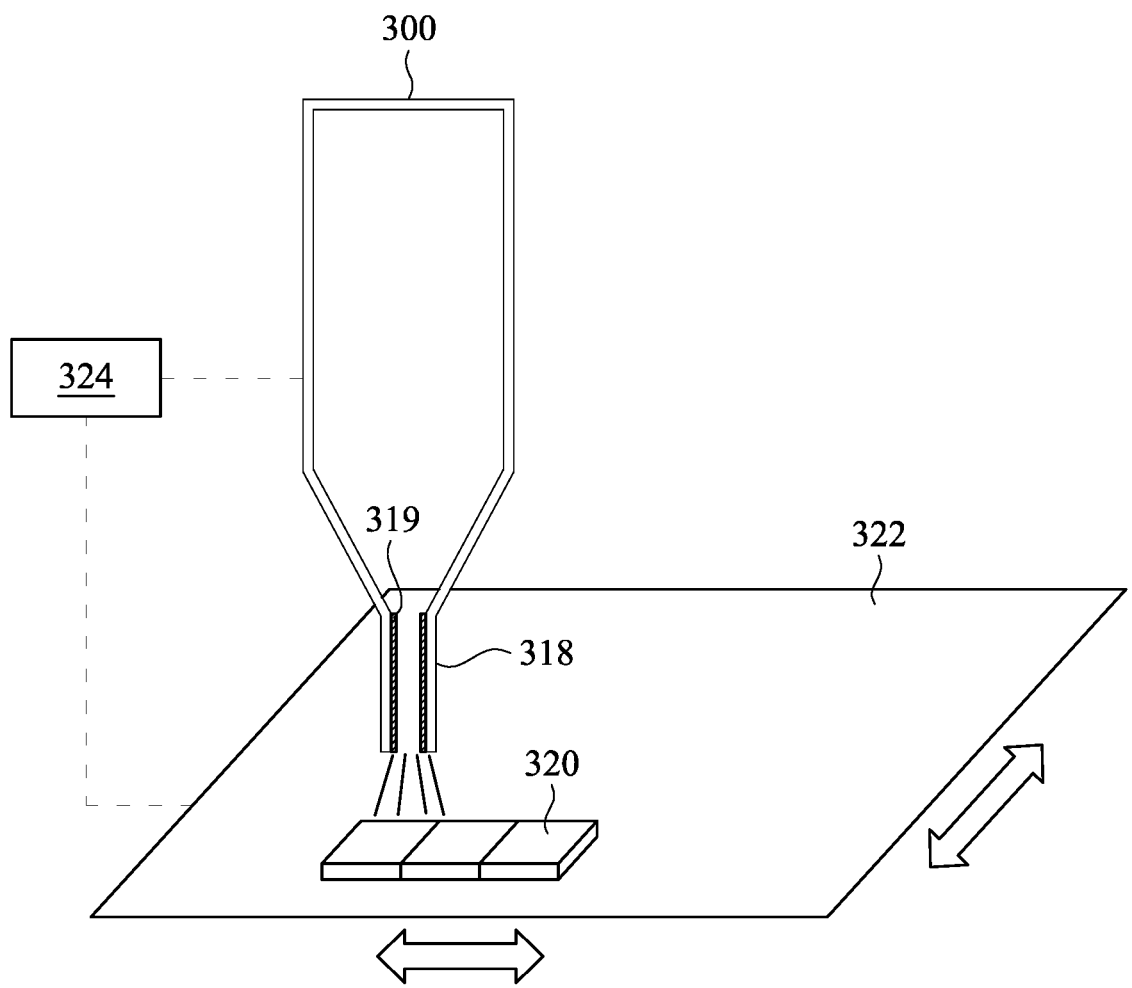

Next, FIG. 3B is a drawing illustrating one embodiment for performing step 210 of the method of FIG. 2. The system is illustrated with reaction vessel 300 providing nanotube fibers/bundles which are sprayed through nozzle 318 to form deposits 320 on the filter 322. Here, the filter moves along the x-axis and/or y-axis using an X-Y motion platform, to position a series of deposits 320 adjacent to one another to form a nanotube membrane. A controller 324 may be used for controlling the various components of the system.

The nanotube fibers and bundles can be sprayed through the nozzle using conventional methods. For example, a carrier gas may be used to spray the nanotube fibers and bundles past the valve and out of the nozzle. The gas flow rate of the fibers and bundles onto the filter can range from about 10 standard cubic centimeters per minute (sccm) to about 500 sccm. At too low a flow rate, the nanotubes will not be deposited where desired. At too high a flow rate, the membrane may be damaged.

The nozzle may have any desired shape, such as rectangular or circular. The shape of the nozzle may affect the shape of the deposits, as will be explained further herein. The nozzle diameter may be from about 0.1 millimeter (mm) to about 50 mm, or in particular embodiments from about 0.1 mm to about 1 mm. To prevent clogging, the inner surface 319 of the nozzle may be coated with a material with low surface energy, and the nozzle is cleaned periodically. Examples of materials with low surface energy may include nitrocellulose, nylon, PTFE, PVC, and polycarbonate.

Figure 3C:
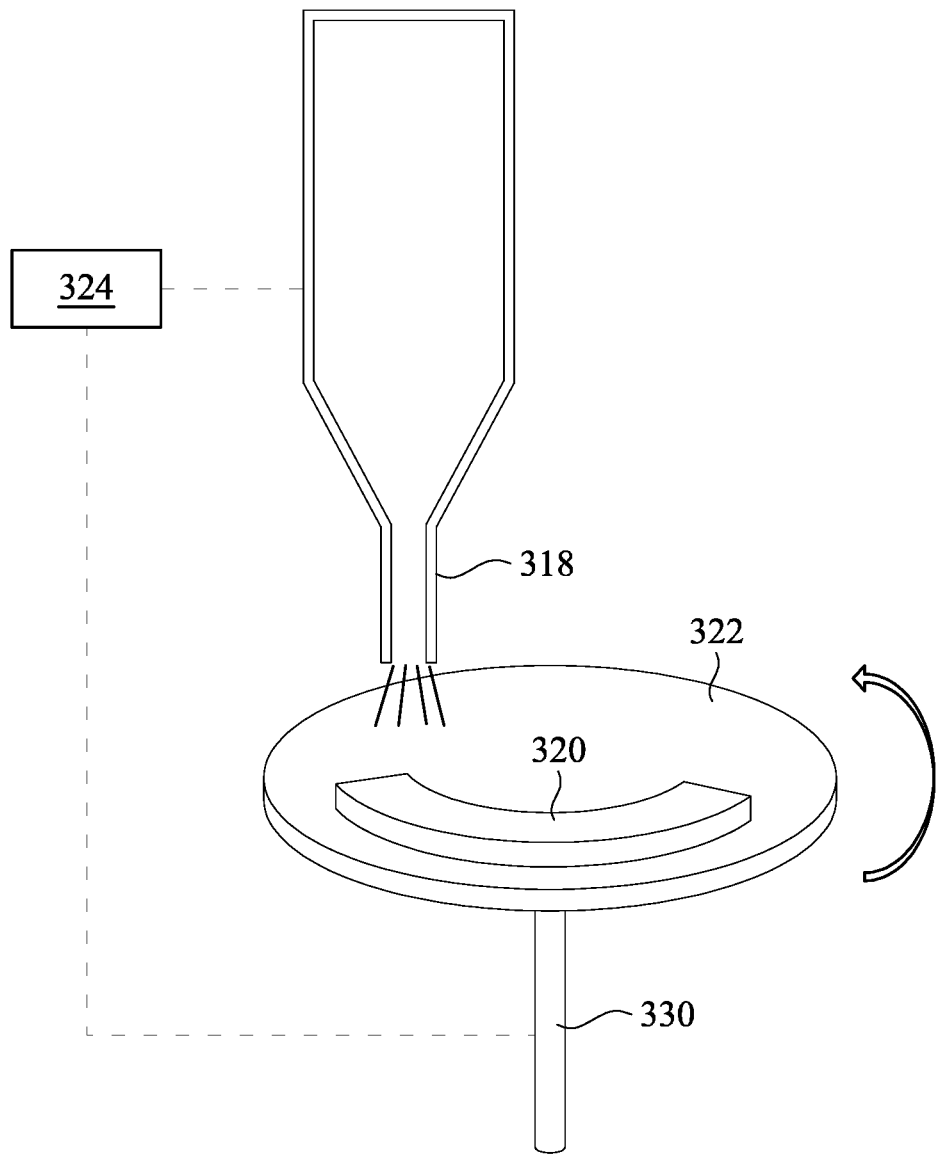

Next, FIG. 3C is a drawing illustrating another embodiment for performing step 210 of the method of FIG. 2. Here, the filter 322 is rotated relative to the nozzle 318, for example around shaft 330 (powered by a motor). It is noted that the deposits 320 are made circumferentially onto the filter, or in other words not on top of the center or the shaft around which the filter rotates. It is also noted that the filter does not have to be circularly shaped to be rotated.

Figure 3D:
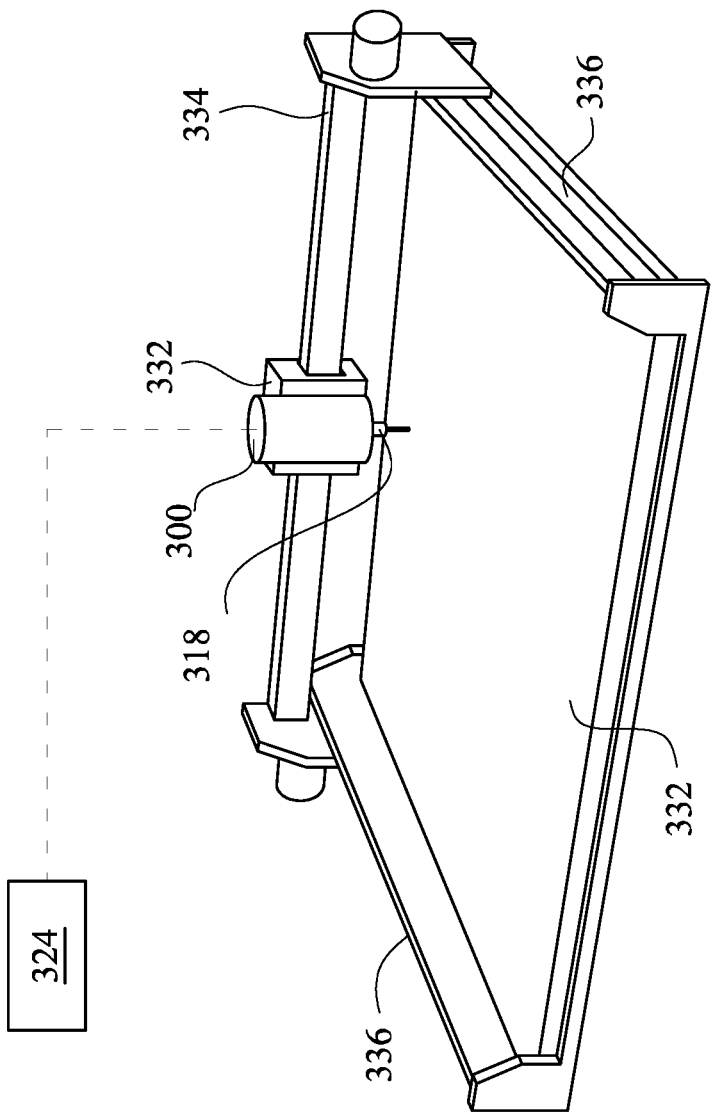

Next, FIG. 3D is a drawing illustrating a third embodiment for performing step 210 of the method of FIG. 2. Here, the filter 322 is held stationary. Instead, the reaction vessel 300 and nozzle 318 are mounted on a moving assembly 332 above the filter to deposit the bundles onto the filter 322. For example, the moving assembly moves along x-axis rails 334 and y-axis rail 336 by various motors (not shown).

The controller 324 may be used to control the various inputs and outputs and moving components, and to measure various conditions during the various steps. The systems may also include sensors for monitoring applicable parameters. For example, such sensors may include those for tracking the flow rate of the various reactants and gases, for measuring output through the nozzle, for moving the filter and/or nozzle and reaction chamber, etc. The controller can also determine whether to increase or decrease various parameters, control the motion of the various components, etc. The controller may operate a computer program which identifies desirable parameters and alters other parameters as appropriate. The controller may also include a user interface for communicating with operators.

The controller may be implemented on one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. Such devices typically include at least memory for storing a control program (e.g. RAM, ROM, EPROM) and a processor for implementing the control program.

FIGS. 3E-3J are a set of diagrams illustrating various nozzle spray patterns and deposition patterns for the dry printing methods of the present disclosure. Each diagram includes, from top to bottom, a perspective view, a chart indicating the level of deposition across a cross-section of the deposition pattern, and a plan view of the deposition pattern.

Figure 3J:
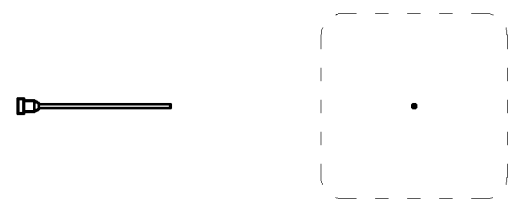
FIGS. 3E-3J are a set of diagrams illustrating various nozzle spray patterns and deposition patterns for the dry printing methods of the present disclosure. The patterns of FIG. 3E and FIG. 3F can be formed using a rectangular nozzle. The patterns of FIGS. 3G-3J can be formed using a circular nozzle.
Figure 3I:
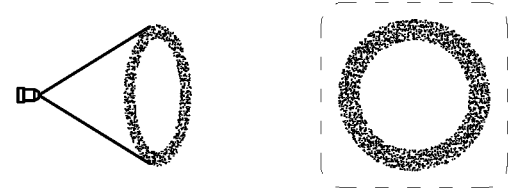
Figure 3H:
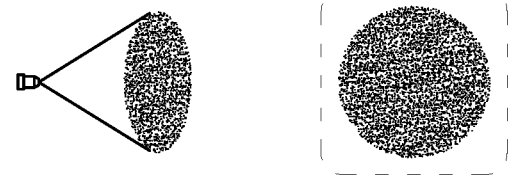
Figure 3G:
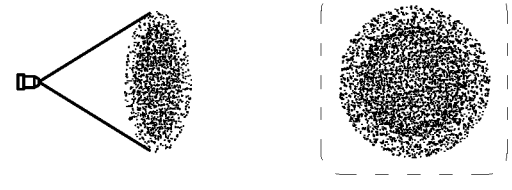
Figure 3F:
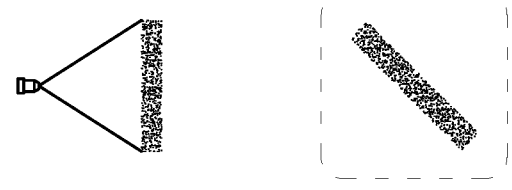
Figure 3E:
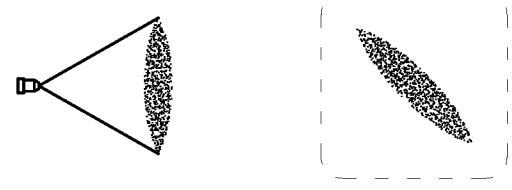

The patterns of FIG. 3E and FIG. 3F can be formed using a rectangular nozzle. In FIG. 3E, the deposition pattern has a convex distribution of the nanotubes, with the plan view having an ovular shape. In FIG. 3F, the deposition pattern has an even distribution of the nanotubes across the deposited rectangle.

The patterns of FIGS. 3G-3J can be formed using a circular nozzle. In FIG. 3G, the deposited pattern has a higher concentration or density of nanotubes in the center, and a lower concentration/density of nanotubes on the perimeter, also referred to herein as a convex distribution. This can result, for example, when the nozzle is positioned too high over the surface of the filter. In FIG. 3H, the nanotubes are more evenly distributed across the entire area compared to FIG. 3G. In FIG. 3I, the deposited pattern has a lower concentration/density of nanotubes in the center, and a higher concentration/density of nanotubes on the perimeter, also referred to herein as a concave distribution or an annular deposition. In FIG. 3J, the deposited pattern is a relatively small, tight circle with even concentration/density. These deposition patterns can be obtained using methods known in the art.

Figure 4A:
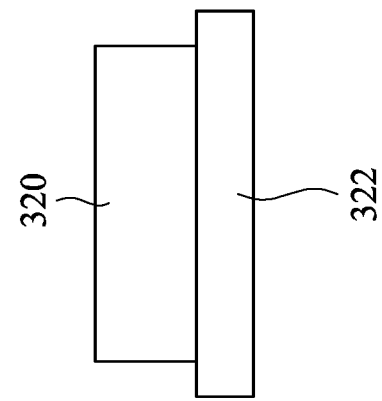
FIG. 4A-4C are side views of different embodiments of partially deposited fibers on a filter.
Figure 4B:
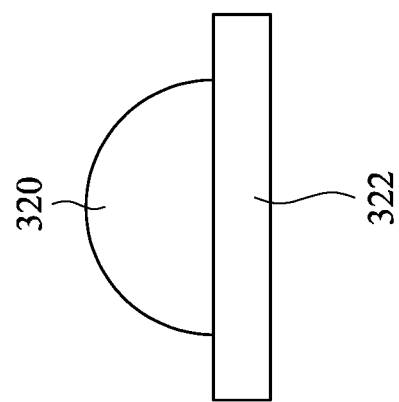
Figure 4C:
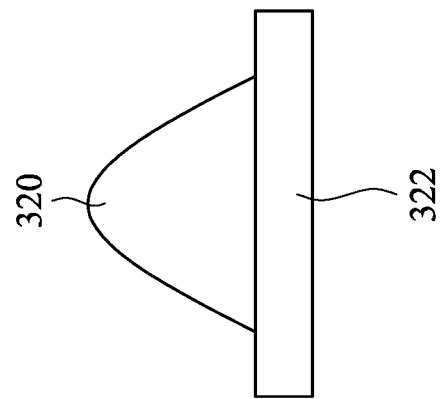

Continuing, FIGS. 4A-4C shows various embodiments of nanotube deposits 320 on a filter 322. As shown in these three side-view illustrations, the deposits 220 may be made in a variety of shapes which can depend on the nozzle shape, flow rate, flow time, and other parameters.

FIG. 4A shows a deposit 320 on a filter 322 in which the thickness/height of the deposit is regular across its length. This can be made, for example, using a rectangular or circular nozzle with a small diameter, and moving the nozzle at a constant rate across the filter. In such a situation, the flow of nanotube fibers/bundles across the area of the nozzle may be considered to be relatively constant.

FIG. 4B depicts a deposit 320 which has a hemispherical shape. This can be made, for example, using a circular nozzle with a relatively large diameter, and holding the nozzle relatively still. It is contemplated that using such a nozzle, nanotube deposition will be heavier in the center of the nozzle compared to the edges of the nozzle.

FIG. 4C depicts a deposit 320 which has a relatively triangular, conical, or Gaussian shape. This may occur where nanotube deposition is much heavier in the center of the nozzle compared to that of FIG. 4B.

Generally, it is contemplated that the desired shape of the nanotube membrane can be made using any nozzle shape by varying the flow rate of nanotube deposition and relative movement between the nozzle and the filter. FIGS. 5A-5C depict several embodiments of membranes 340, 350, 360 formed from deposits 320 on a filter 322 accordingly.

In FIG. 5A, the nanotube membrane 340 is made from rectangular shaped deposits as illustrated in FIG. 4A. The individual fiber deposits 320 are positioned such that the leading edge of one deposit is in contact with the trailing edge of another deposit. The pitch size 342 is the distance between the two midpoints of the deposits. Here, the pitch size 342 is equal to the size of a single deposit.

In FIG. 5B, the nanotube membrane 350 is made from hemispherically shaped deposits as illustrated in FIG. 4B. The hemispherical deposits 322 are deposited such that there is overlap among the deposits 220, or in other words the pitch size is less than the diameter of the deposits. This permits the maximum heights of the various deposits to be "blended" together.

Similarly, in FIG. 5C, the nanotube membrane 360 is made from triangular shaped deposits as illustrated in FIG. 4C. Again, the pitch size is less than the diameter of the deposits, so the maximum heights of the various deposits can be "blended" together.

Continuing, the nanotube membrane can be used in a pellicle membrane, which may be a single-layer membrane or a multi-layer membrane. FIGS. 6-9 show various embodiments of a pellicle membrane 130, pellicle membrane assembly 170, and pellicle assembly 120 according to the present disclosure. In these embodiments, a conformal coating is present.

Figure 6:
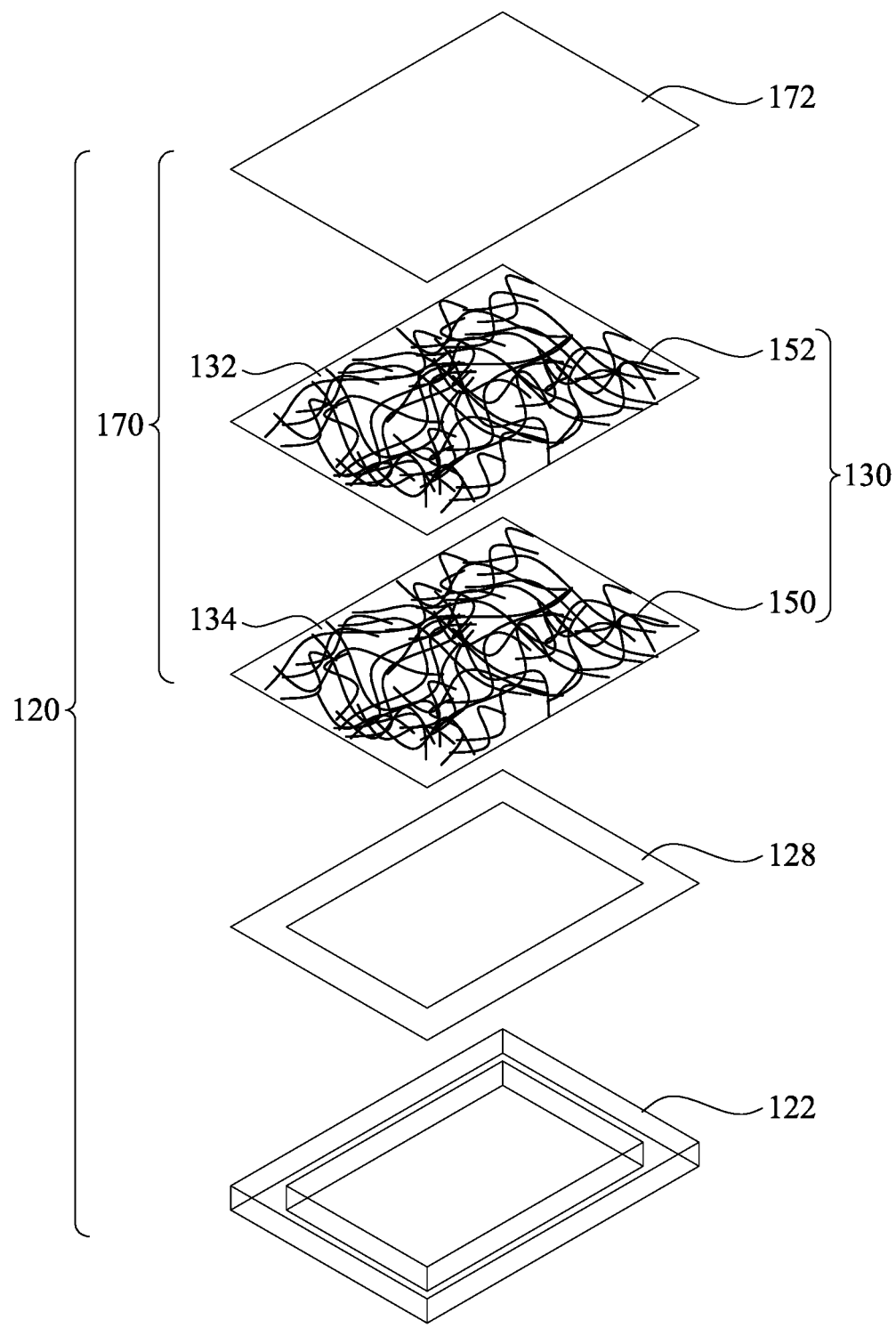
FIG. 6 is an exploded view of a first embodiment of a pellicle membrane, pellicle membrane assembly, and pellicle assembly in accordance with some embodiments.

In the first embodiment of FIG. 6, the pellicle membrane 130 is a multi-layer structure formed from a first nanotube membrane layer 150 and a second nanotube membrane layer 152. As illustrated here, the first nanotube membrane layer 150 and the second nanotube membrane layer 152 are formed from randomly oriented nanotubes, and the two layers contact each other.

Here, the second nanotube membrane layer is also considered the outer surface 132 of the pellicle membrane, to which a conformal coating is applied. The conformal coating may be considered to form the outermost layer 172 of the pellicle membrane. In some embodiments, the outermost layer has a thickness of about 1 nanometer (nm) to about 10 nm. The first nanotube membrane layer is also considered the inner surface 134 of the pellicle membrane and is attached to a border 128. The border runs along the perimeter of the pellicle membrane. The border is also attached to a mounting frame 122.

The combination of the outermost layer/conformal coating 172 and the pellicle membrane 130 together is referred to as a pellicle membrane assembly 170 herein. The combination of the pellicle membrane assembly 170, border 128, and mounting frame 122 is referred to herein as a pellicle assembly 120.

Figure 7:
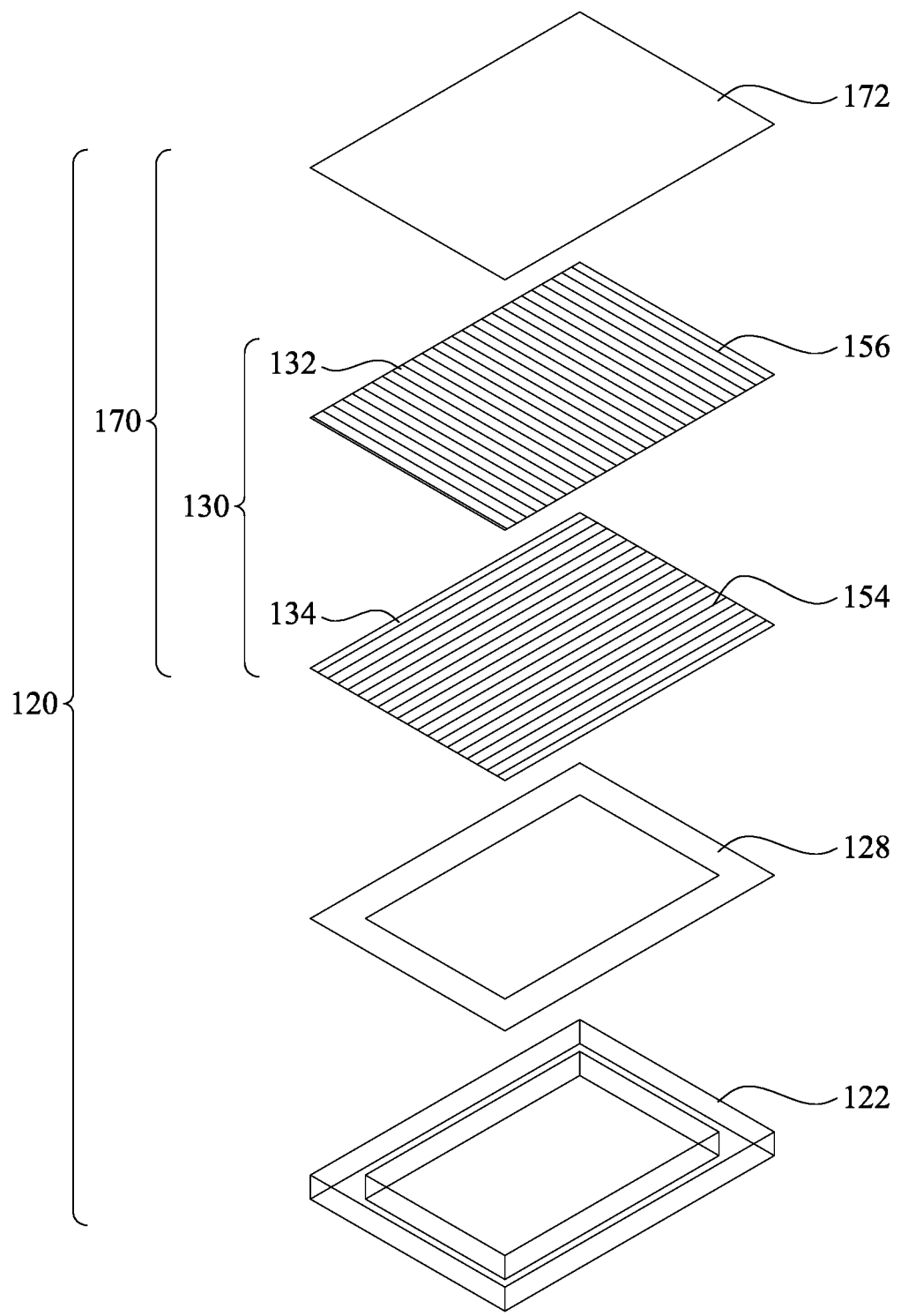
FIG. 7 is an exploded view of a second embodiment of a pellicle membrane, pellicle membrane assembly, and pellicle assembly in accordance with some embodiments.

FIG. 7 is an exploded view of a second embodiment of a pellicle membrane 130, pellicle membrane assembly 170, and pellicle assembly 120 according to the present disclosure. In contrast to FIG. 6, the first nanotube membrane layer 154 and the second nanotube membrane layer 156 are formed from directionally oriented nanotubes. In some embodiments, the directionally oriented nanotube membrane layers are aligned at an angle relative to each other. Here, the two nanotube membrane layers 154, 156 are aligned at 90° relative to each other.

Figure 8:
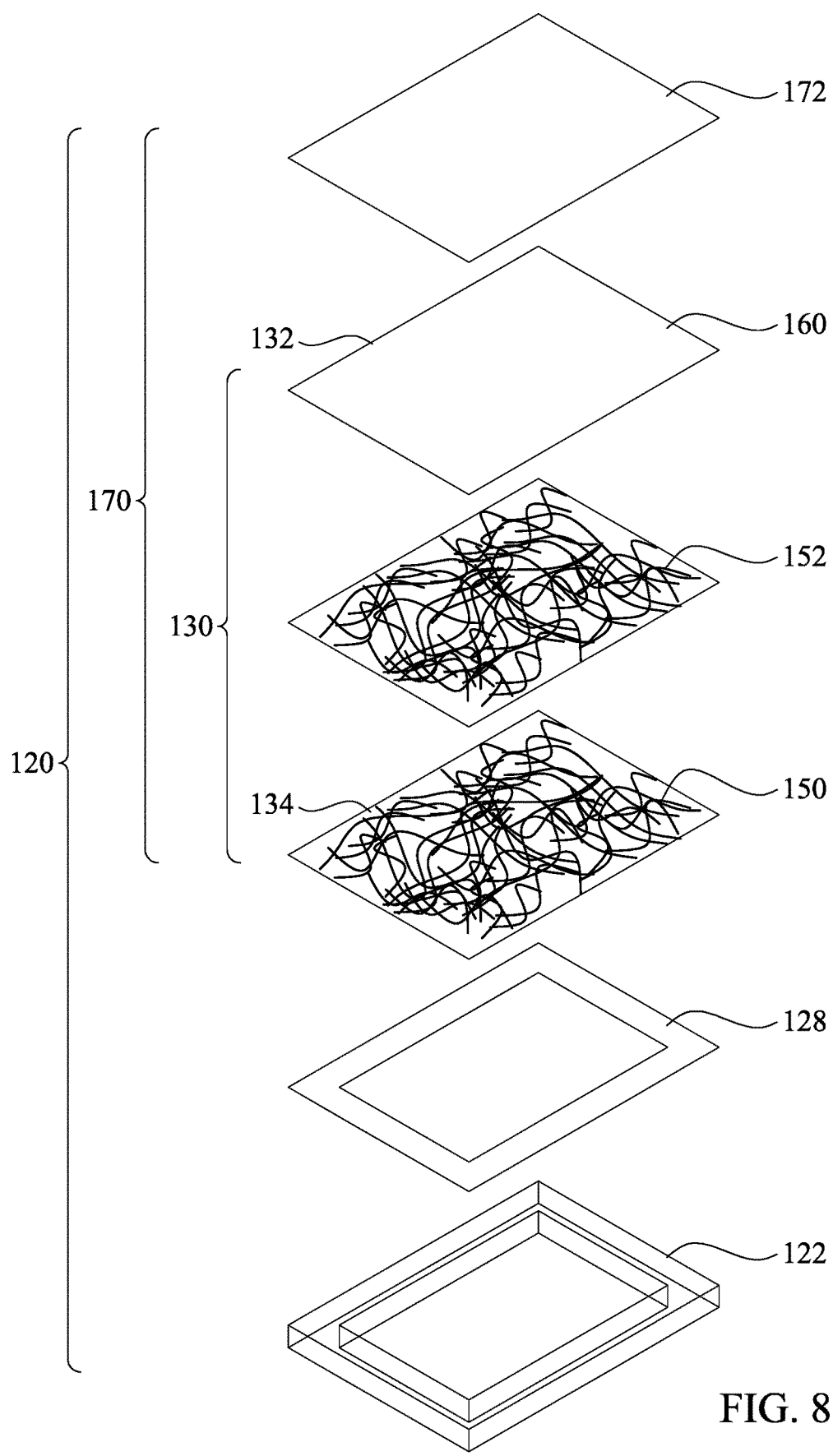
FIG. 8 is an exploded view of a third embodiment of a pellicle membrane, pellicle membrane assembly, and pellicle assembly in accordance with some embodiments.

FIG. 8 is an exploded view of a third embodiment of a pellicle membrane 130, pellicle membrane assembly 170, and pellicle assembly 120 according to the present disclosure. Here, the pellicle membrane is a multi-layer structure formed from a graphene membrane layer 160, a first nanotube membrane layer 150, and a second nanotube membrane layer 152. The graphene membrane layer is also considered the outer surface 132 of the pellicle membrane. The graphene membrane layer may be, in some embodiments, a porous film or a continuous film without pores. The first nanotube membrane layer is also considered the inner surface 134 of the pellicle membrane and is attached to the border 128. The first nanotube membrane layer 150 and the second nanotube membrane layer 152 are formed from randomly oriented nanotubes. In some embodiments, the graphene membrane layer 160, the first nanotube membrane layer 150, and the second nanotube membrane layer 152 directly contact each other.

Figure 9:
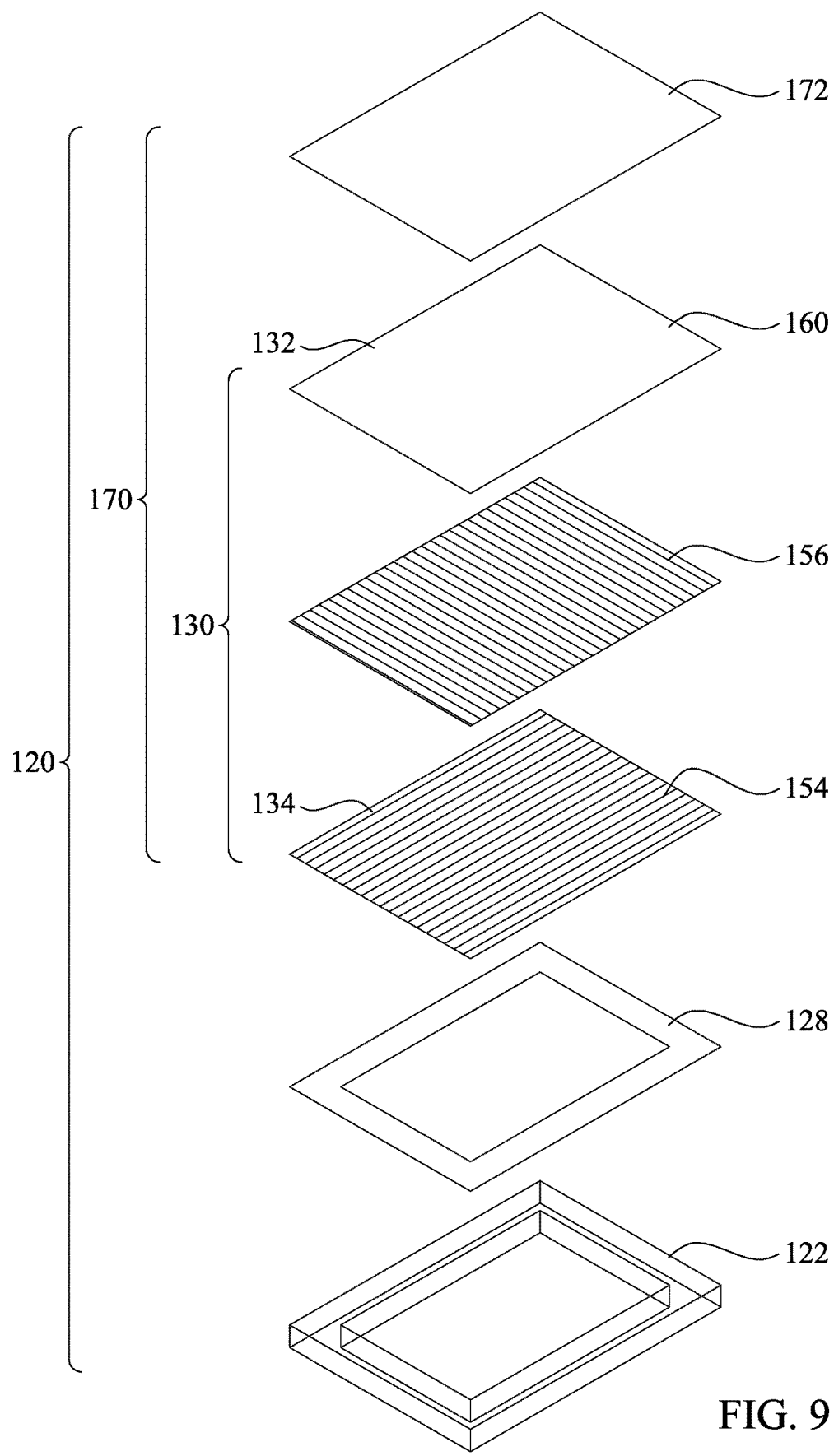
FIG. 9 is an exploded view of a fourth embodiment of a pellicle membrane, pellicle membrane assembly, and pellicle assembly in accordance with some embodiments.

FIG. 9 is an exploded view of a fourth embodiment of a pellicle membrane 130, pellicle membrane assembly 170, and pellicle assembly 120 according to the present disclosure. The pellicle membrane is similar to that of FIG. 8, except the first nanotube membrane layer 154 and the second nanotube membrane layer 156 are formed from directionally oriented nanotubes, as in the embodiment of FIG. 7.

In some different embodiments not illustrated, the graphene membrane layer 160 forms the inner surface 134 of the pellicle membrane and is attached to the border 128. The second nanotube membrane layer would be considered the outer surface 132 of the pellicle membrane. Both nanotube membrane layers can be formed from randomly oriented nanotubes or directionally oriented nanotubes and contact each other.

In other embodiments not illustrated, the graphene membrane layer 160 is located between the two nanotube membrane layers. The first nanotube membrane layer is also considered the inner surface 134 of the pellicle membrane and is attached to the border 128. The second nanotube membrane layer is considered the outer surface 132 of the pellicle membrane. The first nanotube membrane layer 150 and the second nanotube membrane layer 152 are formed from randomly oriented nanotubes or directionally oriented nanotubes.

Generally, the nanotubes of each nanotube membrane layer can be randomly oriented or can be directionally oriented in a desired direction. The nanotube membrane layer(s), whether randomly oriented or directionally oriented, can be combined as desired. In some embodiments, the nanotube membrane layer(s) in the pellicle membrane are all randomly oriented. In some embodiments, the nanotube membrane layer(s) in the pellicle membrane are all directionally oriented. In these embodiments, the directionally oriented nanotube membrane layers are aligned at an angle relative to each other. That angle can be any angle between 0° and 180°, and for example may be 0°, 30°, 45°, 60°, 75°, 90°, 120°, 135°, 145°. 160°, or 180°.

In addition, in some embodiments, one or more layers of the pellicle membrane are formed from graphene or graphite. Such layers can provide more stiffness compared to layers formed from nanotubes. Graphite is made up of stacked graphene layers, and thus should be considered equivalent to graphene in this disclosure. In contrast to the nanotubes, graphene and graphite are in the shape of flat sheets or porous sheets. Graphene has a Young's modulus of approximately 1,000 GPa.

In some embodiments, the nanotube membrane layer(s), the graphene membrane layer(s), and the resulting pellicle membrane generally should not include any other materials. For example, the membranes should not contain any moisture or any other binders, metals, plastics, surfactants, acids, or other compounds that might have been present in precursor materials or used in prior processing steps. In some embodiments, each individual nanotube membrane layer can have a thickness ranging from about 10 nanometers (nm) to about 100 nm, although thicknesses outside this range are also contemplated. In some embodiments, each individual graphene membrane layer can have a thickness ranging from about 1 nm to about 10 nm, although thicknesses outside this range are also contemplated.

Figure 10A:
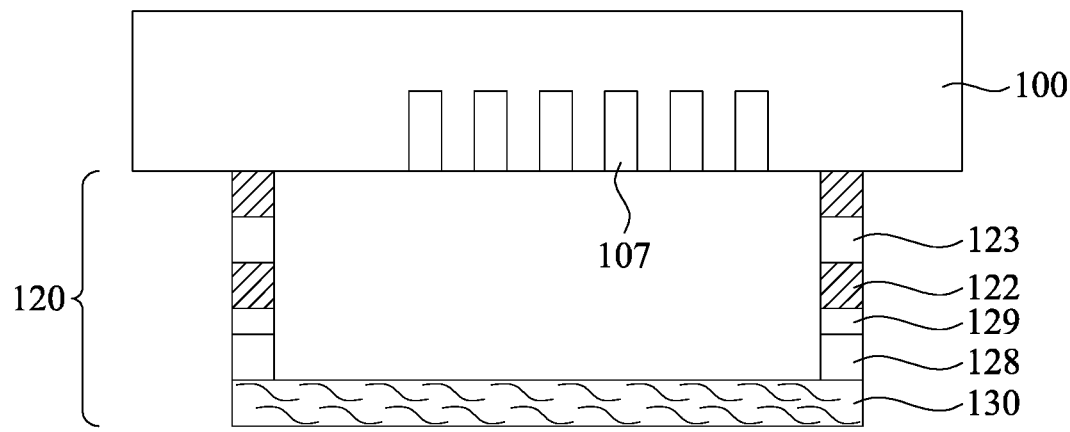
FIG. 10A-10B are side views of different embodiments of a pellicle assembly attached to an EUV reticle.
Figure 10B:
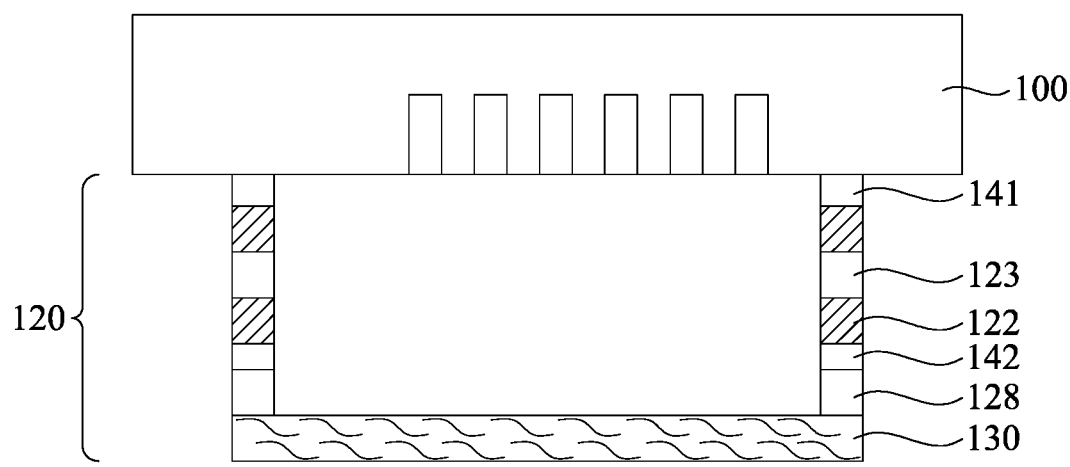

FIGS. 10A-10B are side views showing two different embodiments of a pellicle assembly attached to an EUV reticle. They differ based on whether the pellicle membrane is attached to a mounting frame or a border, and on how the various components of the pellicle assembly are attached to each other.

As illustrated in the first embodiment of FIG. 10A, the EUV reticle 100 includes a patterned image 107. The pellicle assembly 120 includes the pellicle membrane 130 which is attached to border 128 via van der Waals forces. The border 128 is joined to the mounting frame 122 via adhesive layer 129 and protects the patterned image 107 from particle contaminants. As seen here, the mounting frame 122 can include vent holes 123. The mounting frame 122 is joined to the reticle 100 via a mechanical attachment.

In the second embodiment of FIG. 10B, the pellicle membrane 130 is attached to border 128 via van der Waals forces. The border 128 is joined to the mounting frame 122 via a first adhesive layer 129. The mounting frame 122 is joined to the reticle 100 via a second adhesive layer 141.

FIGS. 11A-11C are different views of the mounting frame 122, according to some embodiments of the present disclosure. FIG. 11A is a plan cross-sectional view in which the plane cuts through the vent holes 123, FIG. 11B is a first side view, and FIG. 11C is a front side view. Vent holes 123 are visible on all sides of the mounting frame. However, it is contemplated that vent holes may be present on only one, two, or three sides of the mounting frame.

Both the border and the mounting frame can each be made from suitable materials such as anodized aluminum, stainless steel, plastic, silicon (Si), titanium, silicon dioxide, aluminum oxide ($Al_2O_3$), or titanium dioxide ($TiO_2$). As seen here, vent holes 123 may be present in the mounting frame 122 for equalizing pressure on both sides of the pellicle membrane. In some embodiments, the total area of the vent holes can range from zero to about 100 square millimeters ($mm^2$). It is noted that the pellicle membrane itself is relatively porous, and thus can provide the venting function itself. The vent holes can be spaced apart from each other as desired.

Figure 12:
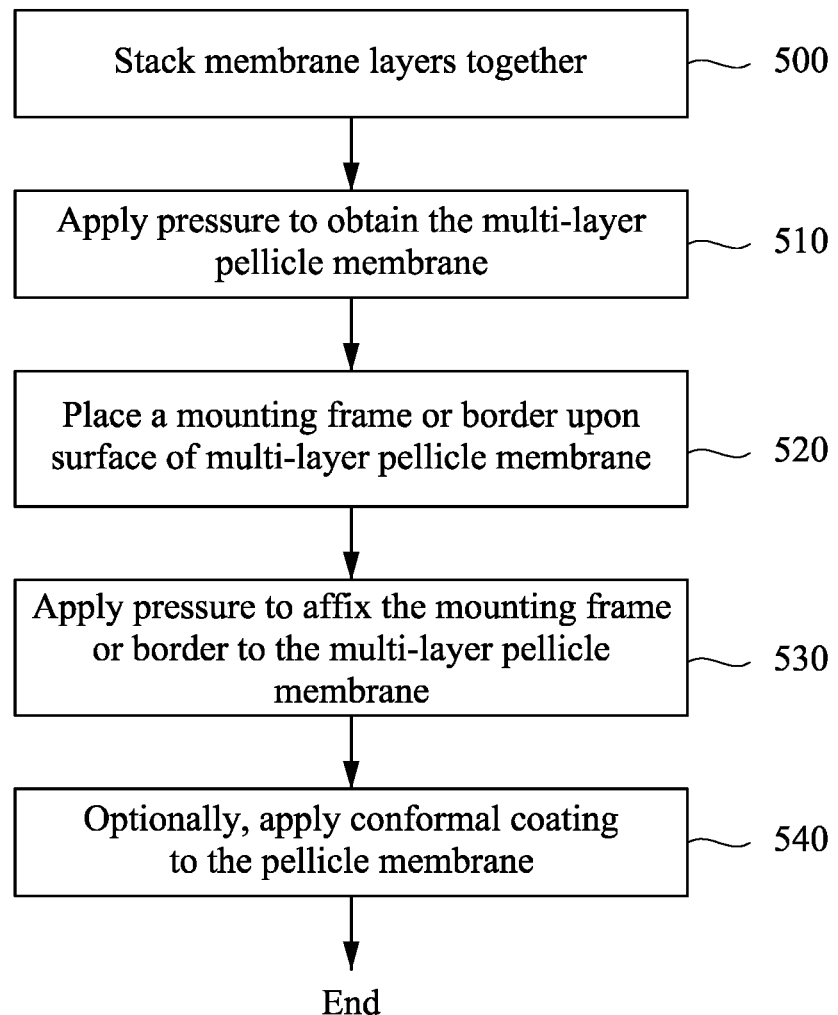
FIG. 12 is a flow chart illustrating another method for preparing a multi-layer structure for a pellicle membrane, in accordance with some embodiments.

FIG. 12 is a flow chart illustrating one embodiment of a method for preparing a multi-layer structure for a pellicle membrane. Very generally, in step 500, the individual layers are stacked upon each other in their desired order. At least one of the layers is a dry-printed nanotube membrane layer. Next, in step 510, pressure is applied to reduce the thickness and join the individual layers together to obtain the multi-layered pellicle membrane. Two or more individual layers can be joined together in this single compression step. Next, in step 520, a mounting frame or border is placed adjacent to a surface of the pellicle membrane. Then, in step 530, pressure is applied to affix the pellicle membrane to the mounting frame or border. In optional step 540, the conformal coating is applied to the pellicle membrane.

Figure 13A:
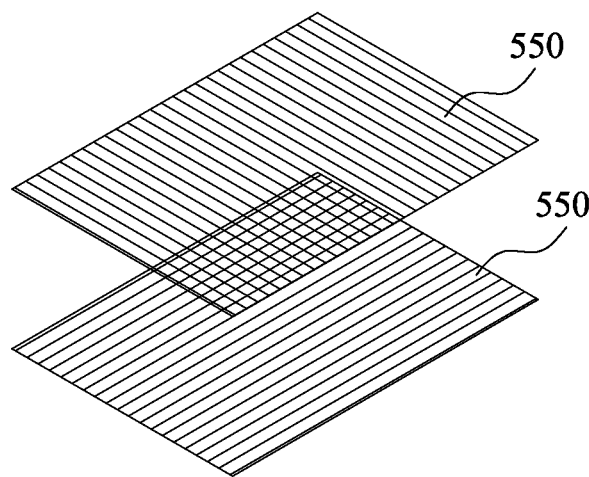
FIGS. 13A-13C are a set of diagrams illustrating the method of FIG. 12, in accordance with some embodiments.
Figure 13B:
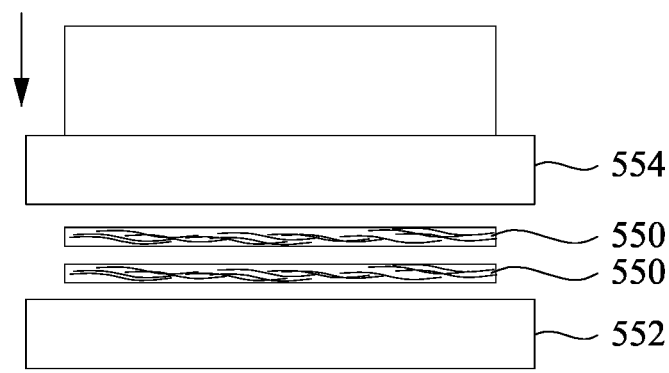
Figure 13C:
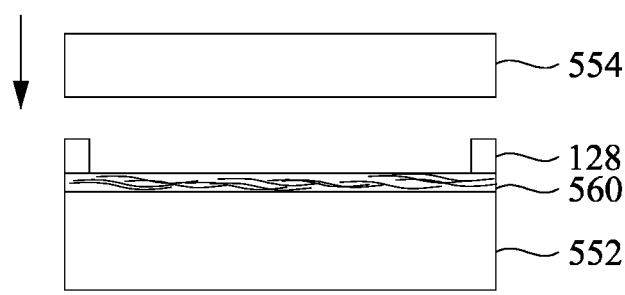

FIGS. 13A-13C are a set of drawings illustrating some steps of the method of FIG. 12, in one embodiment. A conformal coating is not applied in this set of drawings.

In FIG. 13A, two directionally oriented initial nanotube membranes 550 are illustrated. They can be placed at any angle relative to each other, ranging from 0° to 100° and any range in between, although the relative angle is not critical. In FIG. 13B, the two initial nanotube membranes 550 are concurrently compressed between the bolster plate 552 and the ram 554 of a pressing machine, resulting in the multi-layer pellicle membrane 560. In FIG. 13C, the border 128 is laid upon the pellicle membrane 560, and compressive pressure is applied to join them together.

In some embodiments, the compressive pressure applied is from about 0.1 bar to about 20 bar (about 0.01 MPa to about 2 MPa). In some embodiments, the compressive pressure is applied for a time period of about 1 minute to about 60 minutes. The degree of pressure can change during this time period. For example, the force can be increased gradually to a given force and then maintained at that force level.

In this regard, after compression, the nanotube membrane layer has a higher density than its initial state, and the nanotube membrane layer is also thinner than its initial state (i.e. reduced thickness). Without being bound by theory, it is believed that the deformation of the nanotube membrane layer introduced by the uniaxial compression is maintained after the compressive force is removed by van der Waals forces. In other words, the nanotube membrane layer does not return to its original thickness after the compressive force is removed.

Figure 14:
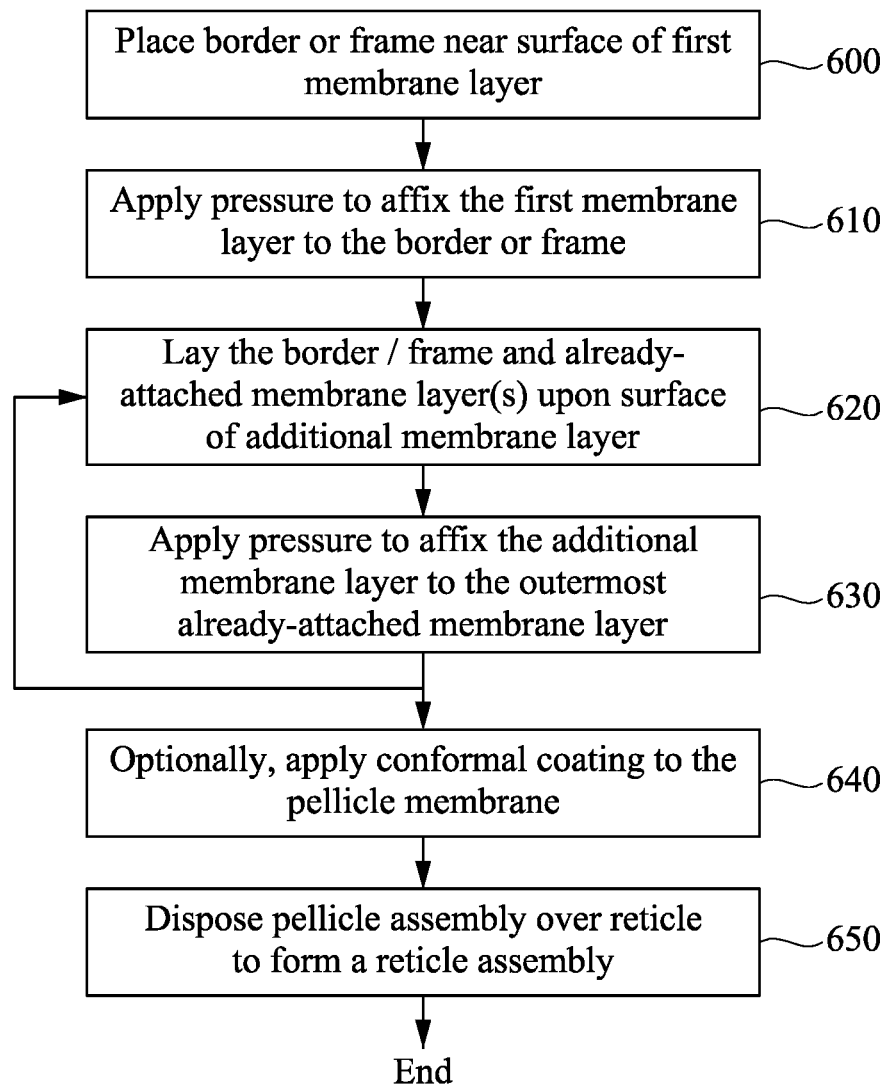
FIG. 14 is a flow chart illustrating a method for preparing a multi-layer structure for a pellicle membrane, in accordance with some embodiments.

FIG. 14 is a flow chart illustrating another embodiment of a method for preparing a multi-layer structure for a pellicle membrane. Very generally, in step 600, a border or mounting frame is placed adjacent to a surface of a first membrane layer. Next, in step 610, pressure is applied to affix the first membrane layer to the border/frame. The first membrane layer and the border/frame remain attached via Van der Waals forces. If it is desired to make the pellicle membrane from more than one layer, then in step 620, the border/frame and any already-attached membrane layer(s) are laid upon a surface of the additional membrane layer. The outermost already-attached membrane layer contacts the surface of the additional membrane layer. Next, in step 630, pressure is applied again to affix the additional membrane layer to the already-attached membrane layer(s). Steps 620 and 630 can be repeated with additional membrane layers until the desired multi-layer structure of the pellicle membrane is assembled, and a pellicle assembly is obtained. In optional step 640, the conformal coating is applied to the pellicle membrane. Finally, in step 650, the pellicle assembly is disposed over a mask pattern on a reticle to form a reticle assembly.

Figure 15A:
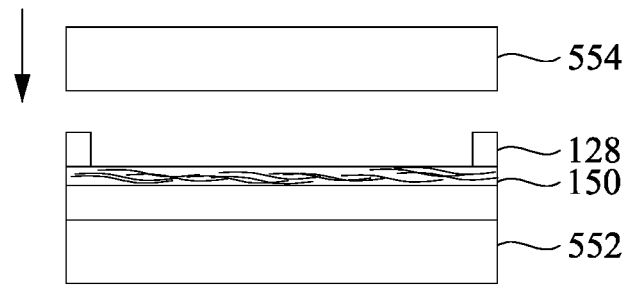
FIGS. 15A-15C are a set of diagrams illustrating the method of FIG. 14, in accordance with some embodiments.
Figure 15B:
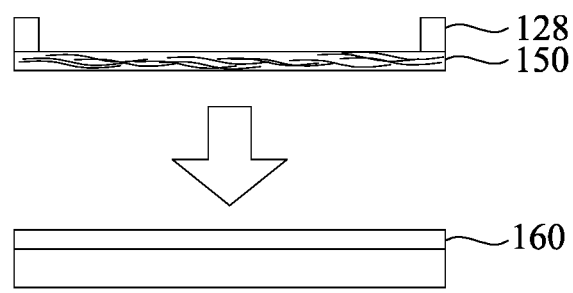
Figure 15C:
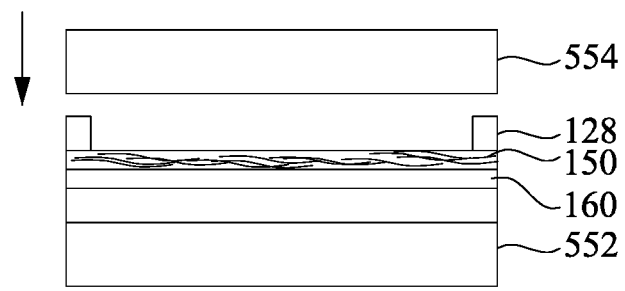

FIGS. 15A-15C are a set of drawings illustrating some steps of the method of FIG. 14, in one embodiment. In FIG. 15A, a first nanotube membrane layer 150 is affixed to the border 128 through pressure applied by a pressing machine comprising a bolster plate 552 and a ram 554. In FIG. 15B, the border 128 and first nanotube membrane layer 150 (already attached to the border 128) are then laid upon a graphene membrane layer 160. In FIG. 15C, pressure is again applied through the pressing machine to attach the graphene membrane layer 160 to the first nanotube membrane layer 150. A multi-layer pellicle membrane can thus be built up successively. It is noted that the thickness of the multi-layer pellicle membrane might vary slightly between the center of the pellicle membrane and the edges of the pellicle membrane where pressure has been used to attach the layers to the border.

Figure 16A:
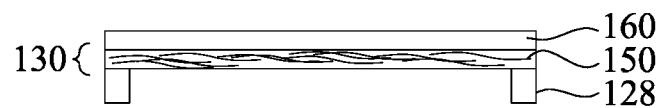
FIGS. 16A-16D are a set of diagrams illustrating a method for coating an outer surface of a pellicle membrane, in accordance with some embodiments.
Figure 16B:
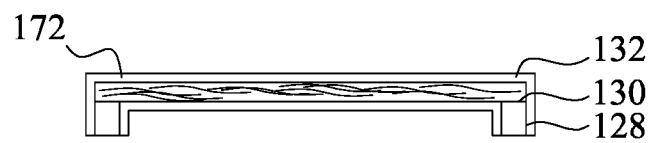
Figure 16C:
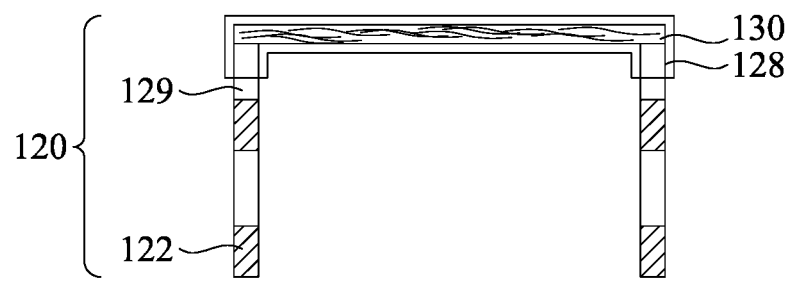
Figure 16D:
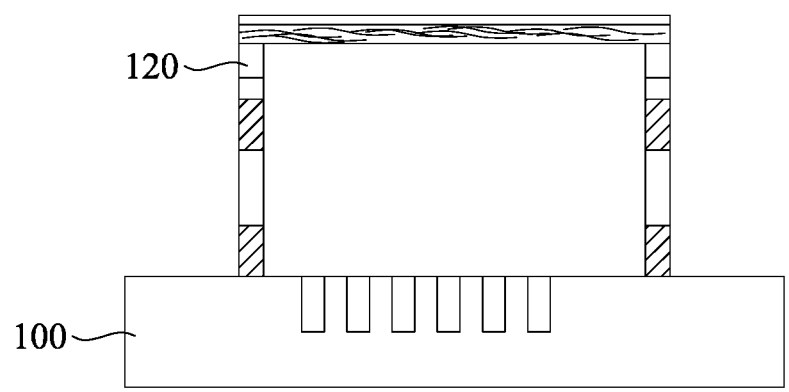

If desired, a conformal coating can be applied to the outer surface of the pellicle membrane. This is illustrated in FIGS. 16A-16D, in one embodiment. FIG. 16A shows the assembly of the border 128 and the pellicle membrane 130, which is comprised of a nanotube membrane layer 150 and a graphene membrane layer 160. The border is directly attached to the nanotube membrane layer 150, which acts as the inner surface 134 of the pellicle membrane 130. The graphene membrane layer 160 acts as the outer surface 132 of the pellicle membrane 130. As seen in FIG. 16B, a coating is applied to the outer surface 132 of the pellicle membrane 130 to form the outermost layer 172. It is noted that the coating is illustrated as also being applied to the sides of the pellicle membrane, and the coating can also end up on the border 128 due to the application process. In FIG. 16C, the coated pellicle membrane 130 and border 128 are then attached to a mounting frame 122, for example through adhesive layer 129, to form a pellicle assembly 120. In FIG. 16D, the pellicle assembly 120 is mounted to the reticle 700 (having the desired mask pattern) by securing the frame to the reticle, with the pellicle membrane disposed over the mask pattern, to produce a final reticle assembly, such as that shown in FIG. 1 by way of non-limiting illustrative example.

The conformal coating can be applied by conventional methods known in the art, such as spraying, dip coating, etc. It is desired that the conformal coating conforms to the exposed surfaces of the pellicle membrane, so that the pores which are present in the pellicle membrane remain present and are not filled by the conformal coating. Such exposed surfaces may be present in any or all of the different layers of a multi-layer pellicle membrane. In addition, the conformal coating will penetrate into the pellicle membrane, rather than being a single discrete layer upon the pellicle membrane.

When applied, the conformal coating is intended to protect the pellicle membrane from damage that can occur due to heat and hydrogen plasma created during EUV exposure. Generally, the material used for the coating should have a low refractive index, i.e. should be as close to 1 as possible when measured at a wavelength of 13.5 nm. The material used for the coating should also have a low extinction coefficient at a wavelength of 13.5 nm. The extinction coefficient measures how easily the material can be penetrated by the wavelength. Desirably, the material used for the conformal coating has a transmittance (T %), when measured at an EUV wavelength of 13.5 nm, of greater than 90%, or of greater than 92%, or of greater than 94%, or of greater than 95%, when measured at a thickness of between 1 nanometer and 10 nanometers. This reduces EUV absorption by the conformal coating (permitting further downstream processing) while protecting the pellicle membrane.

In some embodiments, the coating comprises B, BN, $B_4C$, $B_2O_3$, SiN, $Si_3N_4$, $SiN_2$, SiC, $SiC_xN_y$, Nb, NbN, NbSi, NbSiN, $Nb_2O_5$, $NbTi_xN_y$, $ZrN_x$, $ZrY_xO_y$, $ZrF_4$, $ZrSi_2$, YN, $Y_2O_3$, YF, Mo, $Mo_2N$, MoSi, $MoSi_2$, MoSiN, Ru, RuNb, RuSiN, TiN, $TiC_xN_y$, $HfO_2$, $HfN_x$, $HfF_4$, or VN. In some embodiments, the outermost layer has a thickness of about 1 nanometer (nm) to about 10 nm. This thickness should be measured as the thickness of the coating on the individual components of each layer in the pellicle membrane, for example the thickness of the coating on a carbon nanotube. The coating may penetrate deeper into the pellicle membrane than this thickness.

FIGS. 17A-17D are a set of side cross-sectional views that depict a first exemplary process of stretching a nanotube membrane to obtain a pellicle membrane. In this exemplary process, the initial membrane is stretched by movement in three directions to reduce its thickness and obtain the nanotube membrane. In addition, in this process, the nanotube membrane can be attached to a mounting frame or a border.

Figure 17B:
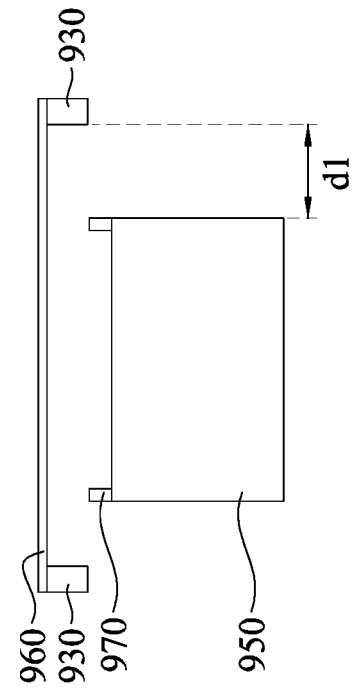
FIGS. 17A-17D are a set of side cross-sectional diagrams illustrating a first exemplary process of stretching a membrane, in accordance with some embodiments.
Figure 17D:
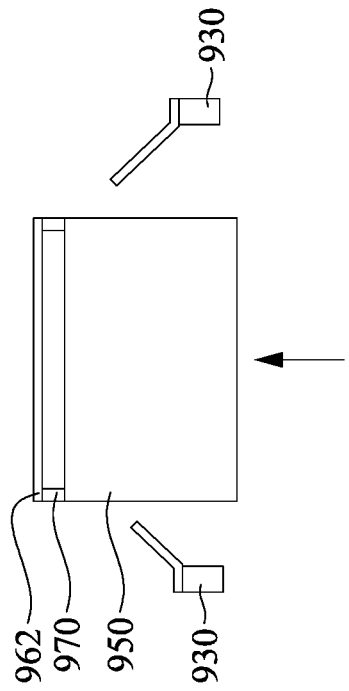
Figure 17A:
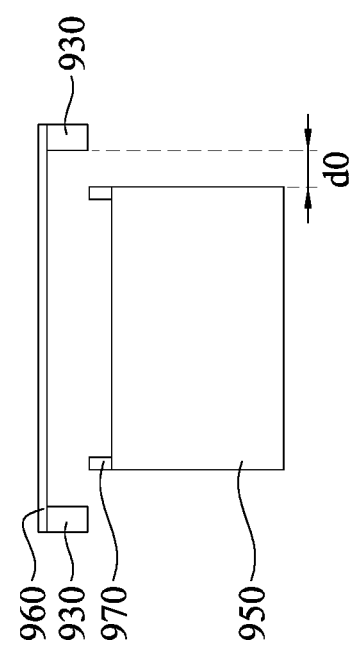

Starting with FIG. 17A, the initial membrane 960 is attached to stretching frame 930. A piston 950 is illustrated here for reference. The distance d0 represents the starting position of the stretching frame and the membrane before stretching, relative to the piston. Also mounted to the head of the piston is a mounting frame 970. At this point, the mounting frame 970 does not contact the initial membrane 960.

Next, in FIG. 17B, the initial membrane 960 is stretched by the stretching frame 930 along the x-axis and/or y-axis. This is indicated by distance d1, which is greater than distance d0. This stretching will also reduce the thickness of the initial membrane. The mounting frame 970 still does not contact the membrane 960.

Figure 17C:
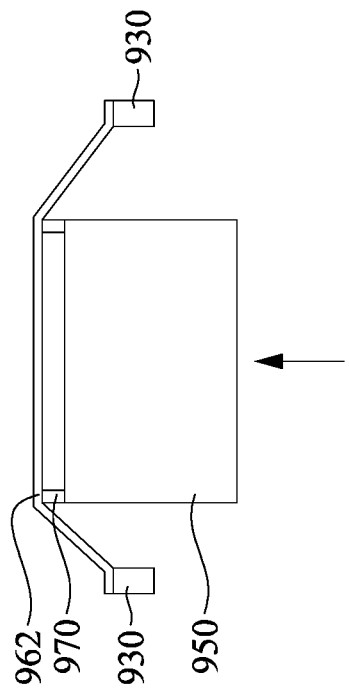

Moving to FIG. 17C, the piston 950 now moves upwards in the z-axis, so that the mounting frame 970 is affixed to the initial membrane, for example via van der Waals forces, to obtain the nanotube membrane 962. The movement in the z-axis will impart shear forces to the nanotube membrane, which will cause some additional stretching of the nanotube membrane, although the majority of the stretching occurs in the x-axis and/or y-axis.

Lastly, as depicted in FIG. 17D, the mounting frame 970 and a portion of the nanotube membrane 962 is cut out and separated from the stretching frame 930 and the remainder of the nanotube membrane 962. A pellicle assembly (still mounted to the piston) is the result.

Figure 18:
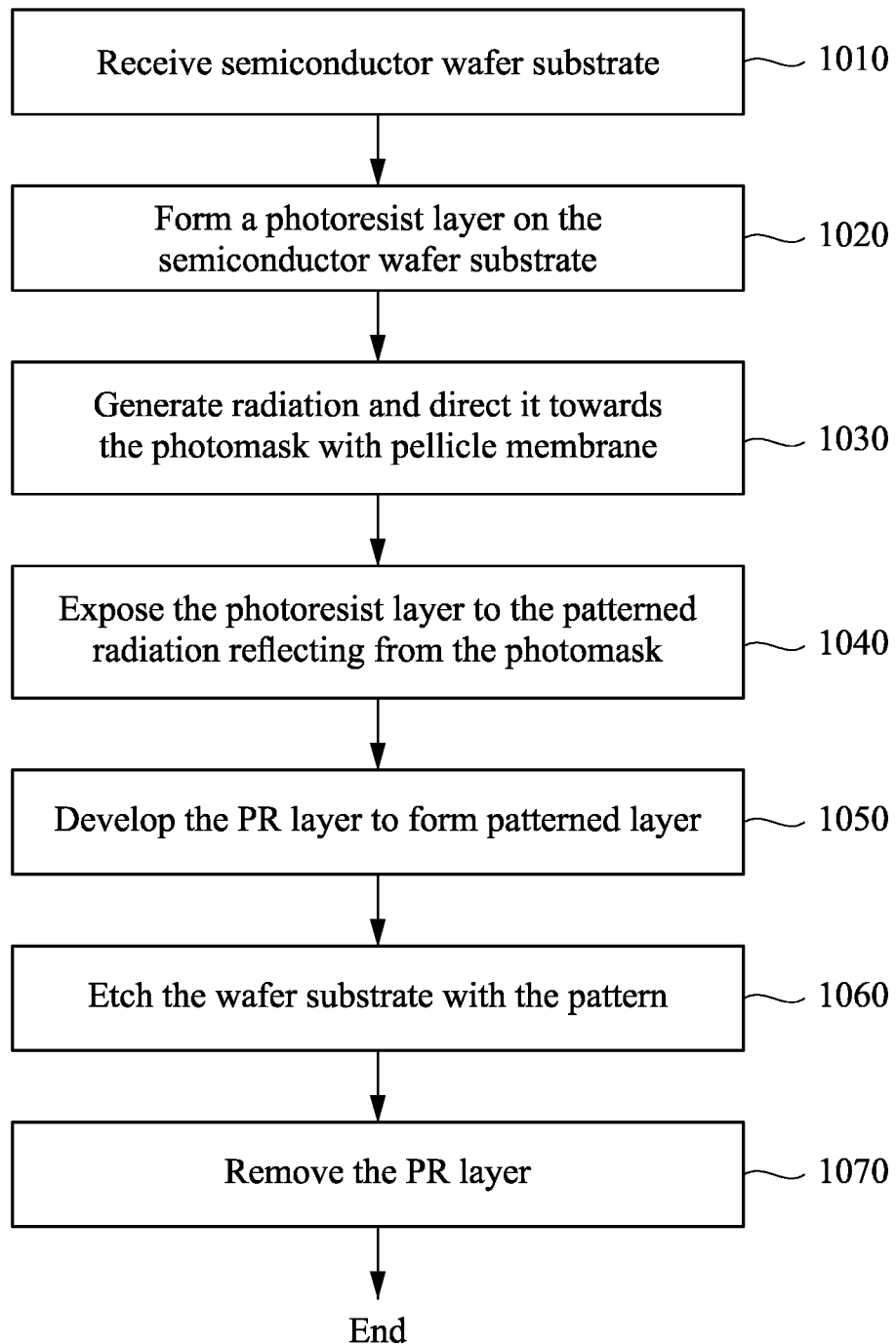
FIG. 18 is a flow chart illustrating a method for processing a semiconductor wafer substrate, in accordance with some embodiments.
Figure 19A:
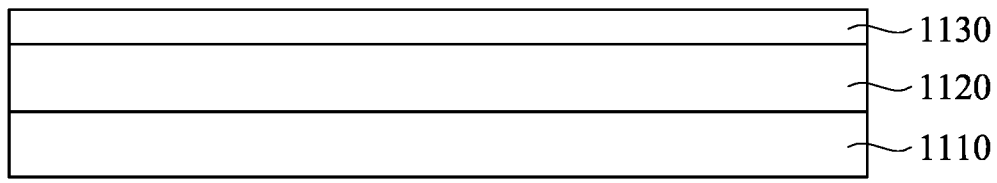
FIGS. 19A-19C are diagrams illustrating some steps of the method for processing a semiconductor wafer substrate, in accordance with some embodiments.
Figure 19B:
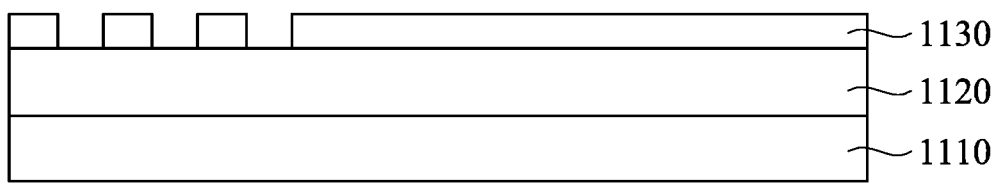
Figure 19C:
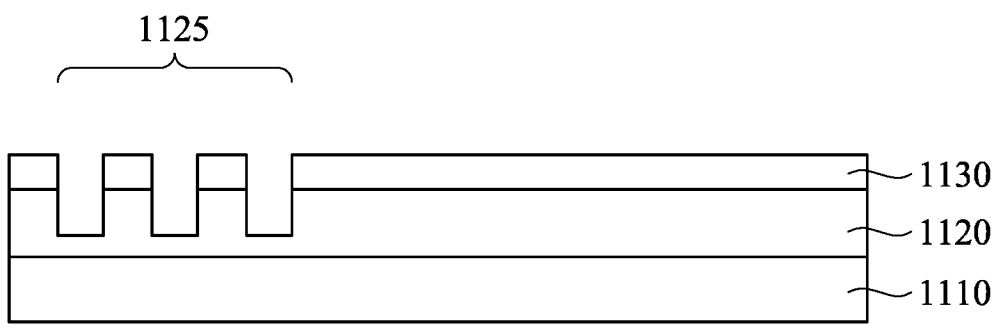

FIG. 18 is a flowchart illustrating a method for processing a semiconductor wafer substrate, in accordance with some embodiments. FIGS. 19A-19C illustrate some of the steps in this method.

In step 1010 of FIG. 18, a semiconductor wafer substrate is received. The substrate is placed in a fixed location within a photolithographic device.

In step 1020 of FIG. 18, a photoresist (PR) layer is formed on the semiconductor wafer substrate. The PR layer is typically deposited using spin-coating, though other methods known in the art can also be used.

FIG. 19A is a side cross-sectional view of the wafer substrate after step 1020. Here, a metal layer 1120 is present on the semiconductor wafer substrate 1110, and the photoresist layer 1130 is present upon the metal layer.

In step 1030 of FIG. 18, radiation is generated and directed at the photomask or reticle. This can be done, for example, using an extreme ultraviolet (EUV) lithography system. EUV light or radiation is directed onto the plane of the photomask. The photomask includes a pellicle membrane, through which the radiation passes before and/or after contacting the photomask. Downstream of the photomask is a projection optics module which is configured for imaging the pattern of the photomask onto the semiconductor wafer substrate, such as a silicon wafer. The lithography system can include other modules or be integrated with or coupled to other modules.

The photomask/reticle is patterned. In particular embodiments, the photomask is a reflective photomask. The photomask/reticle includes a pellicle membrane as described herein. The pellicle membrane comprises at least one nanotube membrane layer that is formed using the dry printing methods described herein. The radiation contacts the photomask/reticle, and is used to transfer the pattern thereon.

In step 1040 of FIG. 18, the PR layer is exposed to the patterned radiation reflected from the photomask. The exposed portion of the photoresist is photochemically modified.

In step 1050 of FIG. 18, the PR layer is developed, such that the pattern from the photomask is now made in the PR layer. This is illustrated in FIG. 19B.

In step 1060 of FIG. 18, the wafer substrate is etched to transfer the pattern to the substrate. This can be done, for example, using dry etching or wet etching. Referring now to FIG. 19C, trenches 1125 are now present in the metal layer 1120. For example, the pattern may be a circuit layout pattern. Alternatively, if the metal layer 1120 was not originally present on the substrate 1110, the metal could subsequently be deposited upon the patterned photoresist layer.

In step 1070 of FIG. 26, the PR layer is removed. Referring to FIG. 19C again, the metal layer contains a circuit layout pattern. Further processing steps can then be performed. The method then ends.

Because the pellicle membrane is in the optical path between the reticle and the wafer upon which the transferred pattern is to be imaged, certain optical properties are desired for the pellicle membrane. For example, the pellicle membrane should have high transmittance (i.e. optically transparent) for EUV wavelengths, low reflectivity for EUV wavelengths, low non-uniformity, and low scattering. During exposure and regular operations, the pellicle membrane will be exposed to high temperatures, and so certain thermal properties are also desirable. For example, the pellicle membrane should have low thermal expansion, high thermal conductivity, and high thermal emissivity. The pellicle membrane should also have good mechanical properties, such as high stiffness (i.e. low sagging or deflection) and stability. The pellicle membranes of the present disclosure have combinations of these desired properties.

The methods described herein provide a pellicle membrane with an improved combination of EUV transmittance, pore size, stiffness, and service lifetime. The pellicle membranes of the present disclosure maintain high transmittance in the EUV wavelength range. This permits more light to reach the photomask for a given exposure energy and also reduces heat buildup in the pellicle membrane. In some embodiments, the pellicle membranes have a transmittance (T %), when measured at an EUV wavelength of 13.5 nm, of greater than 90%, or of greater than 95%, or of greater than 96%, or of greater than 97%. The uniformity of the pellicle membrane can be measured by calculating the standard deviation of the T %. Ideally, the standard deviation is under 0.4%, with a lower value being more desired.

One means by which the high transmittance is obtained is through the presence of pores in the pellicle membrane, since the pores do not reflect or absorb EUV wavelengths. The pellicle membranes of the present disclosure have an average pore size that is small enough to prevent particles from passing through the pellicle membrane and landing on the reticle/photomask. In some embodiments, the maximum pore size of the pores in the pellicle membranes is less than 30 nm in diameter (after the conformal coating has been applied). In this regard, a pore is considered to be any straight path that passes entirely through the pellicle membrane. Pores may be present due to spaces between nanotubes, or between the flakes/sheets of graphene or graphite. The pore size is the smallest diameter of this straight path (because a particle only has to be trapped before passing through the pellicle membrane, it does not have to be stopped at the outer surface of the pellicle membrane). In a multi-layer pellicle membrane, the pore size of the pellicle membrane is usually much smaller, because the pores of a given membrane layer do not align with the pores of another membrane layer. The pore size can be measured using conventional methods, for example by imaging the membrane and measuring the size of each pore.

The increased stiffness of the pellicle membrane minimizes any potential sagging or deflection that may occur over time. For example, the dimensions of the pellicle membrane (length and width) are on the order of about 100 millimeters. The pellicle membranes of the present disclosure may sag or deflect in the range of about 100 μm to about 300 μm under an applied pressure differential of two pascals (Pa). In embodiments, the pellicle membrane may have a thickness ranging from about 10 nanometers (nm) to about 100 nm, or from about 20 nm to about 70 nm.

The pellicle membranes of the present disclosure also have low reflectivity for EUV wavelengths. Again, this permits more light to reach the photomask for a given exposure energy and also reduces critical dimension (CD) error. In some embodiments, the pellicle membranes have a reflectivity (R %), when measured at an EUV wavelength of 13.5 nm, of 5% or less, or of 3% or less, or of 2% or less, or of 1% or less, or of 0.5% or less.

The pellicle membranes of the present disclosure also have low non-uniformity at EUV wavelengths, or in other words have high uniformity. This reduces local CD error that can otherwise occur. In some embodiments, the pellicle membranes have a non-uniformity (U %), when measured at an EUV wavelength of 13.5 nm, of 1% or less, or of 0.5% or less, or of 0.3% or less, or of 0.1% or less.

Referring back to the dry printing methods illustratively described in FIG. 2, these methods have the advantages of reducing the number of processing steps, the time needed to produce nanotube membranes, and increasing possible membrane sizes. This increases throughput and provides additional opportunities for using larger reticles which may provide further opportunities.

Some embodiments of the present disclosure thus relate to methods of forming a nanotube membrane. Nanotube fibers or bundles are produced in a reaction vessel. The nanotube fibers or bundles are then dry deposited through a nozzle downstream of the reaction vessel and onto a filter to form the nanotube membrane. The filter moves relative to the nozzle, so that the shape and thickness of the nanotube membrane can be controlled.

Other embodiments of the present disclosure relate to a system for dry printing a nanotube membrane. The system comprises a reaction vessel in which nanotube fibers are produced. The reaction vessel includes a heat source and a flow control valve for controlling the flow of nanotube fibers or bundles out of the reaction vessel. A nozzle is present downstream of the flow control valve for controlling the shape of a nanotube deposit. A filter is located below the nozzle. The filter and nozzle are configured to move relative to each other.

Also disclosed herein are methods of forming a pellicle assembly. At least one nanotube membrane layer is dry printed. A pellicle membrane is prepared which comprises the at least one nanotube membrane layer. The pellicle membrane is affixed to a mounting frame to obtain the pellicle assembly.

Also disclosed herein are methods for processing a semiconductor wafer substrate. A semiconductor wafer substrate is received. A photoresist layer on the semiconductor wafer substrate is formed. The photoresist layer is then exposed to radiation from a reflective photomask. The radiation passes through a pellicle membrane that comprises at least one nanotube membrane layer formed by dry deposition of nanotube fibers or bundles comprising single-wall nanotubes, multi-wall nanotubes, or combinations thereof. The exposed photoresist layer is then developed to obtain a patterned layer. A circuit layout pattern is then formed on the semiconductor wafer substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a nanotube membrane, comprising:
producing nanotube fibers in a reaction vessel;
blowing carbon monoxide or carbon dioxide into the nanotube fibers downstream of the reaction vessel and upstream of a nozzle to promote the formation of nanotube bundles;
dry depositing the nanotube bundles through the nozzle downstream of the reaction vessel and onto a filter to form the nanotube membrane consisting of the nanotube fibers or bundles; and
reducing a thickness of the nanotube membrane deposited upon the filter by applying pressure uniaxially to the nanotube membrane.

2. The method of claim 1, wherein the filter moves relative to the nozzle.

3. The method of claim 2, wherein the filter moves uniaxially or biaxially relative to the nozzle.

4. The method of claim 2, wherein the filter rotates relative to the nozzle, with the nanotube bundles being deposited circumferentially onto the filter.

5. The method of claim 1, wherein the nanotube fibers comprise single-wall nanotubes, multi-wall nanotubes, and combination thereof.

6. The method of claim 5, wherein the nanotube fibers comprise less than 50% of multi-wall nanotubes by number.

7. The method of claim 1, further comprising flowing a carrier gas through the nanotube bundles upstream of the nozzle.

8. The method of claim 1, wherein the nanotube fibers or bundles are deposited at a rate of about 10 sccm to about 500 sccm.

9. The method of claim 1, further comprising applying suction to the filter.

10. The method of claim 1, wherein the nanotube fibers comprise carbon, boron nitride, silicon carbide, molybdenum disulfide, molybdenum diselenide, tungsten disulfide, or tungsten diselenide.

11. A method of forming a nanotube membrane, comprising:
producing nanotube fibers in a reaction vessel;

blowing carbon monoxide or carbon dioxide into the nanotube fibers downstream of the reaction vessel to promote the formation of nanotube bundles; and dry depositing the nanotube bundles through a nozzle downstream of the reaction vessel and onto a filter to form the nanotube membrane.

12. The method of claim 11, further comprising applying suction to the filter.

13. The method of claim 11, wherein a temperature inside the reaction vessel is maintained from about 500° C. to about 1000° C.

14. The method of claim 11, wherein the filter moves relative to the nozzle.

15. The method of claim 14, wherein the filter moves uniaxially or biaxially relative to the nozzle.

16. The method of claim 14, wherein the filter rotates relative to the nozzle, with the nanotube fibers or bundles being deposited circumferentially onto the filter.

17. The method of claim 11, further comprising flowing a carrier gas through the nanotube bundles upstream of the nozzle.

18. The method of claim 11, wherein the nanotube bundles are deposited at a rate of about 10 sccm to about 500 sccm.

19. A method of forming a nanotube membrane, comprising:

producing nanotube fibers in a reaction vessel;

blowing carbon monoxide or carbon dioxide into the nanotube fibers downstream of the reaction vessel to promote the formation of nanotube bundles; and dry depositing the nanotube bundles through a nozzle downstream of the reaction vessel and onto a filter to form the nanotube membrane, wherein the filter moves relative to the nozzle.

20. The method of claim 19, wherein the filter moves uniaxially or biaxially relative to the nozzle, or wherein the filter rotates relative to the nozzle.

* * * * *